United States Patent
Okuyama et al.

(10) Patent No.: US 9,956,748 B2
(45) Date of Patent: May 1, 2018

(54) GAS-BARRIER LAMINATE HAVING FAVORABLE WATER-BARRIER PROPERTY

(71) Applicant: TOYO SEIKAN GROUP HOLDINGS, LTD., Tokyo (JP)

(72) Inventors: Shinpei Okuyama, Yokohama (JP); Yusuke Obu, Tokyo (JP); Shunya Nangou, Yokohama (JP); Naru Kawahara, Yokohama (JP)

(73) Assignee: TOYO SEIKAN GROUP HOLDINGS, LTD., Tokyo (JP)

( * ) Notice: Subject to any disclaimer, the term of this patent is extended or adjusted under 35 U.S.C. 154(b) by 32 days.

(21) Appl. No.: 15/028,083

(22) PCT Filed: Oct. 8, 2014

(86) PCT No.: PCT/JP2014/076996
§ 371 (c)(1),
(2) Date: Apr. 8, 2016

(87) PCT Pub. No.: WO2015/053340
PCT Pub. Date: Apr. 16, 2015

(65) Prior Publication Data
US 2016/0243801 A1    Aug. 25, 2016

(30) Foreign Application Priority Data

Oct. 10, 2013 (JP) .................................. 2013-213127
Mar. 4, 2014 (JP) .................................. 2014-041672

(51) Int. Cl.
*B32B 27/08* (2006.01)
*C08J 7/04* (2006.01)
(Continued)

(52) U.S. Cl.
CPC .............. *B32B 27/36* (2013.01); *B32B 27/08* (2013.01); *B32B 27/30* (2013.01); *B32B 27/308* (2013.01);
(Continued)

(58) Field of Classification Search
CPC ............ C09D 133/02; C09D 123/0876; B32B 2307/7242–2307/7244; C08J 7/045
See application file for complete search history.

(56) References Cited

U.S. PATENT DOCUMENTS 9,676,171 B2 *  6/2017  Okuyama ................. B32B 9/00
2006/0204755 A1  9/2006  Torii et al.
(Continued)

FOREIGN PATENT DOCUMENTS

CN         1747752 A    3/2006
CN       102166511 A    8/2011
(Continued)

OTHER PUBLICATIONS

Machine translation of JP 2009-090633 A, Apr. 2009.*
(Continued)

*Primary Examiner* — Ramsey E Zacharia
(74) *Attorney, Agent, or Firm* — Sughrue Mion, PLLC

(57) ABSTRACT

A gas-barrier laminate (10) of a structure in which a first inorganic barrier layer (3), a water-trapping layer (5) and a second inorganic barrier layer (9) are provided in this order on a plastic base material (1), wherein the water-trapping layer (5) is a layer in which a granular moisture-absorbing agent is dispersed in a matrix of an ionic polymer, the granular moisture-absorbing agent being capable of absorbing moisture to a degree lower than that attained by the matrix, and an organic layer (7) is provided between the water-trapping layer (5) and the second inorganic barrier layer (9), the organic layer (7) serving as an underlying layer (Continued)

for forming the second inorganic barrier layer. The water-trapping layer has excellent barrier property against water and is, at the same time, effectively suppressed from swelling despite it has absorbed moisture. The water-trapping layer is, further, effectively suppressed from losing its activity.

8 Claims, 4 Drawing Sheets

(51) Int. Cl.
- C09D 201/02 (2006.01)
- C09D 201/08 (2006.01)
- B32B 27/36 (2006.01)
- B32B 27/30 (2006.01)
- C09D 123/08 (2006.01)
- C09D 133/02 (2006.01)
- C23C 16/455 (2006.01)

(52) U.S. Cl.
CPC ......... *C08J 7/04* (2013.01); *B32B 2307/7242* (2013.01); *B32B 2307/7246* (2013.01); *C08J 7/045* (2013.01); *C09D 123/0876* (2013.01); *C09D 133/02* (2013.01); *C23C 16/455* (2013.01); *G02F 2201/501* (2013.01)

(56) References Cited

U.S. PATENT DOCUMENTS

| | | |
|---|---|---|
| 2010/0089636 A1 | 4/2010 | Ramadas et al. |
| 2011/0027581 A1 | 2/2011 | Hirose et al. |
| 2012/0118832 A1* | 5/2012 | Yontz .................. B01J 20/264 210/728 |
| 2015/0368498 A1 | 12/2015 | Okuyama et al. |

FOREIGN PATENT DOCUMENTS

| | | |
|---|---|---|
| CN | 203141961 U | 8/2013 |
| EP | 1972656 A1 | 9/2008 |
| JP | 10-329256 A | 12/1998 |
| JP | 2000-255579 A | 9/2000 |
| JP | 2004-018536 A | 1/2004 |
| JP | 2004-142799 A | 5/2004 |
| JP | 2009-090633 A | 4/2009 |
| JP | 2010-511267 A | 4/2010 |
| JP | 2011-131395 A | 7/2011 |
| JP | 2013-059930 A | 4/2013 |
| KR | 2002-0015287 A | 2/2002 |
| WO | 2009/125801 A1 | 10/2009 |
| WO | 2014/123197 A1 | 8/2014 |

OTHER PUBLICATIONS

"Construction method and blending of water-absorbent resin", Chemical Industry Press. Apr. 2004, vol. 1, ISBN 7-5025-5283-9, pp. 7-13, 180-184 (total 30 pages).

Communication dated Jan. 3, 2017 from the State Intellectual Property Office of the P.R.C. in counterpart Application No. 201480066997.9.

International Search Report of PCT/JP2014/076996 dated Jan. 13, 2015.

Communication dated Sep. 26, 2017, issued by the Korean Intellectual Property Office in corresponding Korean Application No. 10-2016-7011485.

Communication dated May 22, 2017, issued from the European Patent Office in corresponding European Patent Application No. 14852871.4.

Ibidapo, T. Adesanya, "Classification of Ionic Polymers," Department of Chemical Engineering and Polymer Technology Faculty of Engineering, Technology and Environmental Sciences, Lagos State University, Ojo-Nigeria, vol. 28, No. 22, pp. 1473-1476, Nov. 1988, (4 pages total).

* cited by examiner

GAS-BARRIER LAMINATE HAVING FAVORABLE WATER-BARRIER PROPERTY

CROSS REFERENCE TO RELATED APPLICATIONS

This is a National Stage of International Application No. PCT/JP2014/076996 filed Oct. 8, 2014, claiming priority based on Japanese Patent Application No. 2013-213127 filed Oct. 10, 2013 and Japanese Patent Application No. 2014-041672 filed Mar. 4, 2014, the contents of all of which are incorporated herein by reference in their entirety.

TECHNICAL FIELD

This invention relates to a gas-barrier laminate having an inorganic barrier layer and a water-trapping layer (moisture-absorbing layer) formed on a plastic base material and, further, having another inorganic barrier layer formed on the water-trapping layer.

BACKGROUND ART

As means for improving properties and, specifically, gas-barrier property of various plastic base materials, there has been known an art of forming an inorganic barrier layer of a silicon oxide or the like by vacuum evaporation on the surfaces of the plastic base materials (patent document 1).

In the applications of various electronic devices that have been developed and put into practice in recent years, such as organic electroluminescent (organic EL) devices, solar cells, touch panels, e-papers and the like, that must avoid leakage of the electric charges, it is a requirement to impart a high degree of water-barrier property to the plastic base materials forming the circuit boards or to the plastic base materials such as films sealing the circuit boards. However, the inorganic barrier layer formed as described above is not capable of meeting the requirement for attaining water-barrier property of a high level. Therefore, a variety of proposals have been made for improving water-barrier property.

A patent document 2, for example, proposes a gas-barrier laminate comprising an inorganic barrier layer formed on the surface of a plastic base material, and a sealing layer formed on the inorganic barrier layer, the sealing layer being dispersed with nanoparticles of a metal oxide or carbon nanotubes as a moisture-absorbing agent.

A patent document 3 proposes a gas-barrier laminate (film) comprising an inorganic barrier layer, an organic layer and a water-trapping layer formed on a base film, the water-trapping layer being formed of a moisture-absorbing polymer (concretely, a polyamide) or being formed by dispersing a moisture-absorbing material such as silica gel or aluminum oxide in a high molecular binder such as a resin that can be cured with electron rays or ultraviolet rays.

Further, a patent document 4 proposes a gas-barrier laminate comprising a gas-barrier film and a moisture-absorbing layer formed by vacuum evaporation on the surface of a plastic base material, the moisture-absorbing layer containing an alkylene oxide, acrylate nanoparticles or an organometal complex.

However, the gas-barrier laminates proposed by the above patent documents 2 to 4 are not, either, capable of attaining high degrees of water-barrier property. To attain a super-barrier property against water having a water vapor permeability of, for example, not more than $10^{-5}$ g/m$^2$/day, it becomes necessary to employ a layer structure that includes many layers (moisture-absorbing layers or sealing layers) for absorbing moisture. As a result, a lot of laborious work is needed for forming a multi-layered structure causing a decrease in the productivity. Therefore, it has been desired to further improve water-barrier properties. Besides, there still remains a problem in that upon absorbing the moisture, the layers (moisture-absorbing layers or sealing layers) undergo swelling and lose dimensional stability. Therefore, it has been urged to provide a moisture-absorbing layer that is capable of exhibiting excellent moisture-absorbing capability over extended periods of time for also realizing super-barrier property using the layers of a number as small as possible.

To meet the above requirements, the present applicant has previously proposed a gas-barrier laminate having a water-trapping layer in which a specific granular moisture-absorbing agent was dispersed in the matrix of an ionic polymer, the water-trapping layer being formed on an inorganic barrier layer on a plastic base material (patent document 5). In the gas-barrier laminate proposed here, the water-trapping layer effectively traps water. Therefore, the gas-barrier laminate not only exhibit very excellent water barrier capability but also effectively suppresses the water-trapping layer from swelling despite of having absorbed moisture. Therefore, super-barrier property against water is realized with the layers of a number as small as possible, and favorable dimensional stability is also attained.

However, the above gas-barrier laminate is still accompanied by such a problem that the water-trapping layer easily loses its activity. Therefore, it has been urged to maintain excellent properties for extended periods of time with stability.

PRIOR ART DOCUMENTS

Patent Documents

Patent document 1: JP-A-2000-255579
Patent document 2: JP-A-2010-511267
Patent document 3: JP-A-2009-90633
Patent document 4: JP-A-2011-131395
Patent document 5: WO2014/123197

OUTLINE OF THE INVENTION

Problems that the Invention is to Solve

It is, therefore, an object of the present invention to provide a gas-barrier laminate having a water-trapping layer that has excellent barrier property against water and is, at the same time, effectively suppressed from swelling despite it has absorbed moisture, the water-trapping layer, further, being effectively suppressed from losing its activity.

Means for Solving the Problems

According to the present invention, there is provided a gas-barrier laminate of a structure in which a first inorganic barrier layer, a water-trapping layer and a second inorganic barrier layer are provided in this order on a plastic base material, wherein:

the water-trapping layer is a layer in which a granular moisture-absorbing agent is dispersed in a matrix of an ionic polymer, the granular moisture-absorbing agent being capable of attaining humidity to a degree lower than that attained by the matrix; and an organic layer is provided between the water-trapping layer and the second inorganic barrier layer, the organic layer serving as an underlying layer for forming the second inorganic barrier layer.

The gas-barrier laminate of the present invention can favorably employ the following embodiments.

(1) The granular moisture-absorbing agent is a crosslinked product of a monovalent metal salt of poly(meth)acrylic acid;
(2) The second inorganic barrier layer has a water vapor permeability of not more than $10^{-1}$ g/m$^2$/day which is larger than a water vapor permeability of the first inorganic barrier layer;
(3) A crosslinked structure has been introduced into the ionic polymer that is forming the matrix;
(4) The organic layer has an adhesive force to the water-trapping layer of not less than 1.0 N/1.5 mm;
(5) The organic layer is a resin layer having a glass transition point of not lower than 60° C.;
(6) The organic layer is formed of a polyester resin, a cycloolefin-type resin, a (meth)acrylic resin or a halogen-type resin;
(7) The first inorganic barrier layer is an inorganic oxide film formed by the CVD method; and
(8) The gas-barrier laminate has a water vapor permeability of not more than $10^{-5}$ g/m$^2$/day.

Effects of the Invention

The water-trapping layer in the present invention is capable of trapping water even in an atmosphere of a very low humidity, and traps water at a rate very larger than the rates at which water permeates through the first and second inorganic barrier layers. Besides, water is trapped by the entire water-trapping layer and is not allowed to leak to the exterior.

Further, water trapped by the matrix in the water-trapping layer is taken in by the moisture-absorbing agent. Therefore, the water-trapping layer is effectively suppressed from swelling despite it has absorbed moisture also accounting for excellent dimensional stability of the gas-barrier laminate of the present invention.

Besides, the gas-barrier laminate of the invention has a structure in which the water-trapping layer is sandwiched between the first inorganic barrier layer and the second inorganic barrier layer. Therefore, the water-trapping layer is effectively suppressed from losing its water-trapping capability despite the gas-barrier laminate has been in the atmosphere, and continues to exhibit its excellent water-barrier property for extended periods of time. For instance, the water-trapping layer is capable of reliably avoiding the probability of losing its activity that could be caused by the absorption of water in the atmosphere when it is still on the production line or on the conveyor line of before being put into practical use. Even at the time of practical use, infiltration of water into the water-trapping layer is suppressed and, hence, the water-trapping layer features a very long life.

In the invention having the above-mentioned sandwich structure, further, the second inorganic barrier layer is present on the water-trapping layer, and the organic layer is formed between the second inorganic barrier layer and the water-trapping layer, the organic layer serving as an underlying layer for forming the second barrier layer. Namely, the water-trapping layer lacks smoothness and, besides, undergoes a slight change in the volume as it absorbs water. Therefore, if the second inorganic barrier layer is formed directly on the water-barrier layer, the adhesiveness is lost.

Or the adhesiveness is also lost even by a slight change in the volume of when moisture is absorbed, and the layers tend to be peeled off. According to the present invention, however, the organic layer is provided as an underlying layer between the water-barrier layer and the second inorganic barrier layer, and on which underlying layer the second inorganic barrier layer is formed making it possible to effectively avoid a decrease in the adhesiveness caused by smooth surfaces or by a slight change in the volume as a result of absorbing moisture.

In the invention, further, the water-trapping layer has a very large water-trapping capability, is effectively suppressed from losing its activity, and continues to exhibit water-barrier property over extended periods of time. Therefore, the second inorganic barrier layer needs to have water-barrier property to such an extent as to decrease the infiltration of water into the water-trapping layer.

For example, in order to shut off the permeation of water as much as possible, the first inorganic barrier layer has a very small water vapor permeability which is, usually, set to be not more than $10^{-3}$ g/m$^2$/day. The second inorganic barrier layer may have a water vapor permeability larger than the above, and is capable of playing its role to a sufficient degree if the water vapor permeability thereof is, usually, not larger than $10^{-1}$ g/m$^2$/day at the greatest. This means that the second inorganic barrier layer may be formed under the conditions milder than those for the first inorganic barrier layer. For instance, the second inorganic layer may be formed in a shortened period of time and, further, may be formed in a thickness smaller than that of the first inorganic barrier layer. This brings about a great advantage from the standpoint of productivity and cost of production.

In the gas-barrier laminate of the present invention, the water-barrier layer exhibits not only excellent dimensional stability but also excellent water-barrier property over extended periods of time. The gas-barrier laminate of the invention comprising basically five layers (plastic base material, first and second inorganic barrier layers, water-trapping layer, organic layer) is capable of acquiring water permeability of not more than $10^{-5}$ g/m$^2$/day. Therefore, the gas-barrier laminate is useful as a substrate or a sealing layer for various electronic devices, and is applicable, specifically, to organic electroluminescent (organic EL) panels, too.

BRIEF DESCRIPTION OF THE DRAWINGS

FIG. 1A illustrates a matrix of a cationic polymer containing much cationic groups (NH$_2$ groups) while FIG. 1B illustrates a matrix of an anionic polymer containing much anionic groups (COONa groups, COOH groups).

MODES FOR CARRYING OUT THE INVENTION

<Principle of Trapping Water>

Figure 1:
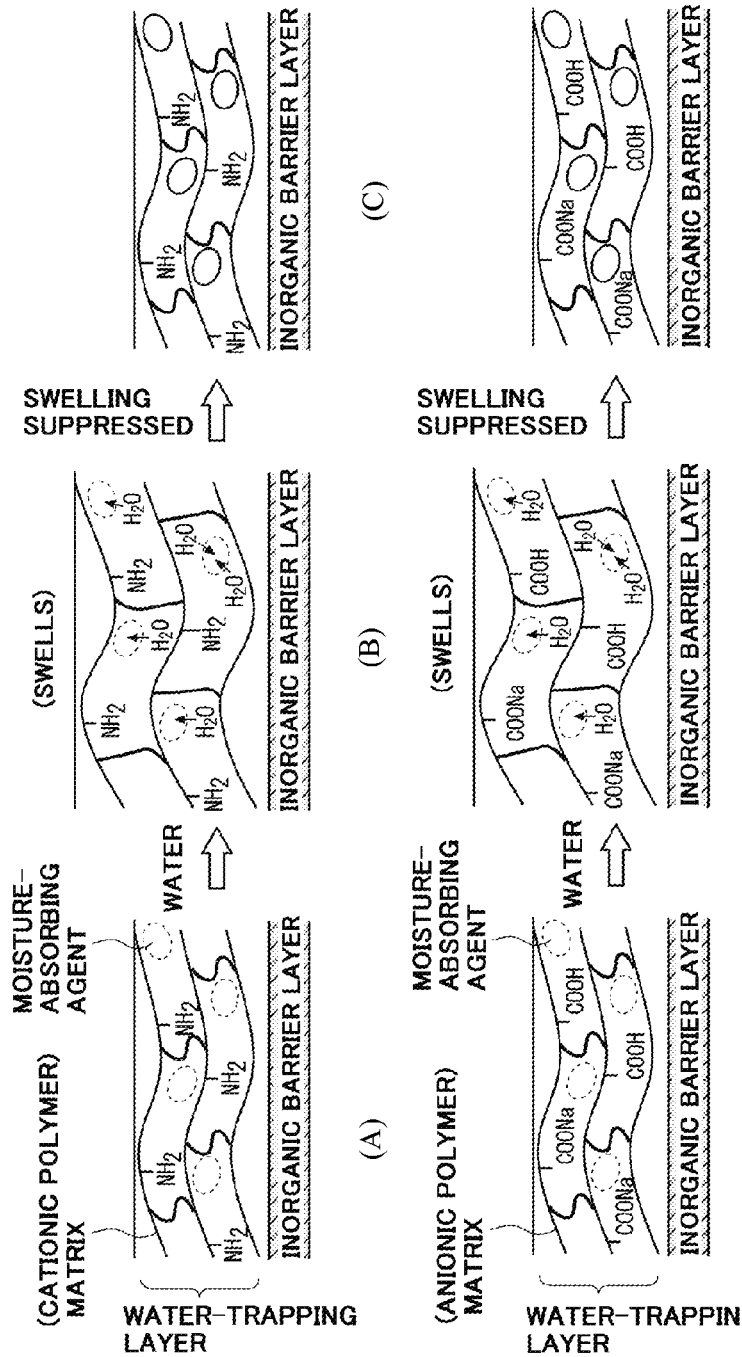
FIG. 1A and FIG. 1B are views illustrating the principle of water-trapping layers in a gas-barrier laminate of the present invention, where

Reference is now made to FIG. 1A and FIG. 1B which illustrate the principle of trapping water by a water-trapping layer in a gas-barrier laminate of the present invention. The water-trapping layer is forming a matrix of an ionic polymer in which a granular moisture-absorbing agent is dispersed. FIG. 1A illustrates a matrix of a cationic polymer containing much cationic groups ($NH_2$ groups) while FIG. 1B illustrates a matrix of an anionic polymer containing much anionic groups (COONa groups, COOH groups) (see (A) in FIG. 1A and FIG. 1B).

In the laminate forming the water-trapping layer, a trace amount of water that has passed through the plastic base material (not shown in FIG. 1A and FIG. 1B) and the inorganic barrier layer is trapped by the water-trapping layer and is absorbed by the matrix (see (B) in FIG. 1A and FIG. 1B). The matrix by itself has a high degree of moisture-absorbing property and, therefore, traps and absorbs water without permitting it to leak.

Here, water that is simply absorbed by the matrix could be easily released if there is a change in the environment such as a rise in the temperature. Besides, water that has infiltrated widens the gap among the polymer molecules that are forming the matrix and, therefore, causes the water-trapping layer to swell.

In the present invention, however, water absorbed in the matrix is, further, trapped by the moisture-absorbing agent that has moisture-absorbing property of a degree larger (i.e., attains humidity to a degree lower) than that of the matrix (see (C) in FIG. 1A and FIG. 1B). This effectively suppresses the swelling despite water molecules are absorbed. Still more, the water molecules are confined in the water-trapping layer. As a result, water is effectively prevented from being released out of the water-trapping layer. According to the present invention as described above, the water-trapping layer has double functions of highly absorbing the moisture and trapping/confining the water. As will be described later, therefore, the water-trapping layer can trap water even in an atmosphere of very low humidity and can, further, trap water at a rate very larger than a rate at which water permeates through the inorganic barrier layer. Water is trapped by the layers as a whole and is not permitted to leak to the exterior. Namely, the gas-barrier laminate of the present invention of a basic structure has layers in a number of as small as five, i.e., has the water-trapping layer and the inorganic barrier layers formed on the plastic base material, and realizes a very high degree of water-barrier property or water permeability of not more than $10^{-5}$ g/m$^2$/day that can be applied to, for example, organic electroluminescent (organic EL) panels.

Further, as will be also understood from FIG. 1A and FIG. 1B, the matrix that assumes the crosslinked structure suppresses an increase in the distance among the molecules of the ionic polymer despite water has infiltrated therein. Therefore, it is made possible to further effectively suppress the swelling caused by the absorption of water.

The water-trapping layer of the invention is capable of trapping water even in an atmosphere of very low humidity and of trapping water at a rate very larger than a rate at which water permeates through the inorganic barrier layers. These facts have been demonstrated in Examples of water trap testing appearing later.

<Structure of Layers of the Gas-Barrier Laminate>

Figure 2:
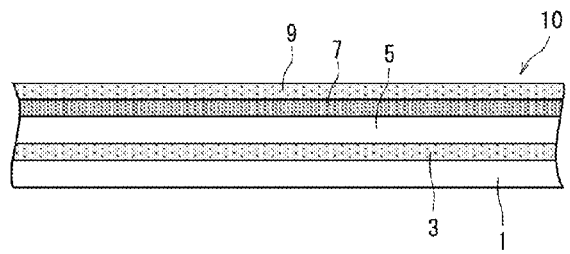
FIG. 2 is a sectional view schematically illustrating the structure of layers of the gas-barrier laminate of the present invention, i.e., illustrating the structure of layers of gas-barrier laminates fabricated in Examples 1 to 4 and 9 to 14, and in Comparative Examples 3 and 4.

Reference is made to FIG. 2 which is a sectional view schematically illustrating the gas-barrier laminate of the present invention having the water-trapping layer mentioned above. The laminate generally designated at 10 comprises a plastic base material 1, a first inorganic barrier layer 3 formed on the surface of the plastic base material 1, and a water-trapping layer 5 formed on the first inorganic barrier layer 3. On the water-trapping layer 5, there is further provided a second inorganic barrier 9 via an organic layer 7.

<Plastic Base Material 1>

In the invention, the plastic base material 1 is made of a plastic material such as thermoplastic or thermosetting resin that is known per se.

As the resin, though not limited thereto only, there can be exemplified polyolefins or cyclic olefin copolymers such as random or block copolymers of α-olefins, like low-density polyethylene, high-density polyethylene, polypropylene, poly 1-butene, poly 4-methyl-1-pentene or ethylene, propylene, 1-butene and 4-methyl-1-pentene; ethylene.vinyl compound copolymers such as ethylene.vinyl acetate copolymer, ethylene.vinyl alcohol copolymer, and ethylene.vinyl chloride copolymer; styrene type resins such as polystyrene, acrylonitrile.styrene copolymer, ABS, and α-methylstyrene.styrene copolymer; polyvinyl compounds such as polyvinyl chloride, polyvinylidene chloride, vinyl chloride.vinylidene chloride copolymer, methyl polyacrylate and methyl polymethacrylate; polyamides such as nylon 6, nylon 6-6, nylon 6-10, nylon 11 and nylon 12; thermoplastic polyesters such as polyethylene terephthalate (PET), polybutylene terephthalate and polyethylene naphthalate (PEN); polycarbonates; polyphenylene oxides; polyimide resin, polyamideimide resin, polyetherimide resin, fluorine-contained resin, allyl resin, polyurethane resin, cellulose resin, polysulfone resin, polyethersulfone resin, ketone resin, amino resin and biodegradable resins such as polylactic acid; as well as blends thereof, those resins suitably modified by being copolymerized, or multilayered structures thereof.

In case transparency is required, it is, specifically, desired to use a polyester resin such as PET or PEN among them. In case heat resistance is, further, required, it is desired to use a polycarbonate or a polyimide resin.

The above resins may be blended with known blending agents such as antioxidant, lubricant, etc., as a matter of course.

There is no specific limitation on the form of the plastic base material 1 if it can exhibit barrier property against water to a sufficient degree. Namely, the plastic base material 1 may assume any suitable form to meet the use but, most generally, assumes the form of a plate, a film or a sheet.

The thickness thereof is set to lie in a suitable range depending upon the requirements (e.g., flexibility, softness, strength, etc.) to meet the use.

Depending on its form and the kind of the plastic material, the plastic base material 1 is formed by a known forming means such as injection or co-injection forming, extrusion or co-extrusion forming, film or sheet forming, compression forming, or cast polymerization.

<First Inorganic Barrier Layer 3>

The first inorganic barrier layer 3 formed on the plastic base material 1 may basically be the same as the second inorganic barrier layer 9 that will be described later, and is an inorganic vapor-deposited film such as a film of various metals or metal oxides formed by the physical vacuum evaporation as represented by sputtering, vacuum deposition or ion plating or by the chemical vacuum evaporation such as plasma CVD. Specifically, the first inorganic barrier layer 3 is a vapor-deposited film formed by the plasma CVD from such a standpoint that it is uniformly formed even on rugged surfaces, it is dense and maintains large adhesiveness to the plastic base material 1 and that it exhibits excellent barrier property.

To deposit the film by the plasma CVD, the plastic base material 1 on which the inorganic barrier layer is to be formed is arranged in a plasma-treating chamber held at a predetermined degree of vacuum, a gas (reaction gas) of a metal or a compound containing the metal for forming the film and an oxidizing gas (usually, oxygen or NOx gas) are fed together with a carrier gas such as argon, helium or the like gas, through a gas feed pipe, into the plasma-treating chamber that is shielded with a metal wall and is reduced to a predetermined degree of vacuum. In this state, a microwave electric field or a high-frequency electric field is applied to generate a glow discharge and, therefore, to generate a plasma by the electric energy thereof so that the decomposed reaction product of the compound is deposited on the surface of the plastic base material 1 to form a film thereof.

If the microwave electric field is applied, the interior of the plasma-treating chamber is irradiated with microwaves by using a waveguide or the like to form the film. If the high-frequency electric field is applied, the plastic base material 1 is so arranged as to be positioned between a pair of electrodes in the plasma-treating chamber, and the high-frequency electric filed is applied to the electrodes to form the film.

As the reaction gas, there is usually used a gas of an organometal compound from the standpoint of forming, on the surface of the plastic base material, a film having a flexible region containing carbon and a region of a high degree of oxidation and excellent barrier property or the above region. Namely, there is preferably used a gas of an organoaluminum compound such as trialkylaluminum or a gas of an organotitanium compound, organozircoium compound or organosilicon compound. Specifically, it is most desired to use a gas of the organosilicon compound from the standpoint of relatively easily and efficiently forming the first inorganic barrier layer 3 having a high degree of barrier property against oxygen.

As the organosilicon compound, there can be used organosiloxane compounds such as hexamethyldisilane, vinyltrimethylsilane, methylsilane, dimethylsilane, trimethylsilane, diethylsilane, propylsilane, phenylsilane, methyltriethoxysilane, vinyltriethoxysilane, vinyltrimethoxysilane, tetramethoxysilane, tetraethoxysilane, phenyltrimethoxysilane, methyltrimethoxysilane and methyltriethoxysilane; and organosiloxane compounds such as octamethylcyclotetracyloxane, 1,1,3,3-tetramethyldisiloxane and hexamethyldisoloxane. There can be, further, used aminosilane, silazane and the like.

The above organometal compounds can be used alone or in a combination of two or more kinds.

In forming the film by the plasma CVD by using the reaction gas of the above-mentioned organometal compound and an oxidizing gas according to the present invention, it is desired that the film is formed by the plasma reaction with a small glow discharge output (e.g., microwave output or high-frequency output) at first and, thereafter, with a large glow discharge output.

That is, organic groups ($CH_3$, $CH_2$, etc.) contained in the molecules of the organometal compound, usually, volatilize as $CO_2$. Here, if the output is small, part of the organic groups are not decomposed into $CO_2$ but deposits on the surface of the plastic base material 1 and remains contained in the film. As the output increases, on the other hand, the organic groups are decomposed into $CO_2$. Upon increasing the output, therefore, it is made possible to form the film of a highly oxidized metal that is contained in the organometal compound while decreasing the amount of carbon in the film. The film of a highly oxidized metal has a very high degree of barrier property against gases such as oxygen and the like but has poor flexibility and does not adhere to the plastic base material to a sufficient degree. On the other hand, the film of a lowly oxidized metal and containing much organic component does not have a high degree of barrier property against gases but is rich in flexibility and highly closely adheres to the plastic base material 1.

According to the present invention as will be understood from the above description, the film is, first, formed by the plasma CVD by using the organometal compound as the reaction gas and with a small output. The film is, thereafter, formed by increasing the output to form a highly adhesive region containing much organic component (carbon) on the portion that comes in contact with the surface of the plastic base material 1 and to form, thereon, a region of a highly oxidized metal having a high degree of gas-barrier property.

In order to maintain excellent gas-barrier property, therefore, if the degree of oxidation of a metal (M) is denoted by x (atomic ratio x=O/M), it is desired that the inorganic barrier layer 3 in the gas-barrier laminate 10 of the present invention includes a highly oxidized region in which the degree of oxidation is 1.5 to 2.0. On the lower side of the highly oxidized region (on the side coming in contact with the surface of the plastic base material 1), further, it is desired that there is formed an organic region where the carbon (C) concentration is not lower than 20 atomic % on the basis of the three elements of metal (M), oxygen (O) and carbon (C). Further, the metal (M) is preferably silicon (Si).

It is desired that the highly oxidized region in the first inorganic barrier layer 3 is present in a thickness of not less than 60% of the whole thickness of the first inorganic barrier layer 3. It is, further, desired that the above organic region is formed in the first inorganic barrier layer 3 and in a thickness of about 5 to about 40% of the whole thickness thereof on the side that cores in contact with the plastic base material 1.

In forming the first inorganic barrier layer 3 having the above-mentioned organic region and the highly oxidized region by the plasma CVD, the glow discharge output differs to some extent depending upon if microwaves are used or high-frequency waves are used. If microwaves are used, for example, the organic region is formed with a low output of about 30 to about 100 W and the highly oxidized region is formed with a high output of not less than 90 W. Further, if high-frequency waves are used, the organic region is formed with a low output of about 20 to about 80 W and the highly oxidized region is formed with a high output of not less than 100 W.

The film-forming time may be so set that that the thicknesses of the regions lie within the ranges mentioned above.

The whole thickness of the first inorganic barrier layer 3 may vary depending on the use of the gas-barrier laminate 10 or the required level of gas-barrier property but is, usually, such that properties of the plastic base material 1 are not impaired and that a water vapor permeability is maintained to be not more than $10^{-2}$ g/m²/day and, specifically, not more than $10^{-3}$ g/m²/day. Though dependent upon the ratio occupied by the above highly oxidized region, the whole thickness of the first inorganic barrier layer 3 is 4 to 500 nm and, specifically, about 30 to about 400 nm.

<Water-Trapping Layer 5>

As described earlier, the water-trapping layer 5 formed on the first inorganic barrier layer 3 has a moisture-absorbing matrix formed of an ionic polymer, i.e., cationic polymer or anionic polymer. That is, the water-trapping layer 5 has a structure in which a moisture-absorbing agent is dispersed in the matrix, the moisture-absorbing agent being capable of attaining humidity to a degree lower than that of the matrix.

By forming the water-trapping layer 5 having the above dispersion structure on the first inorganic barrier layer 3, it is allowed to obtain a very high degree of barrier property against water as described above.

Moisture-Absorbing Matrix (Cationic Polymer).

In the present invention, the cationic polymer used for forming the moisture-absorbing matrix is a polymer having in the molecules thereof cationic groups that could turn into a positive electric charge in water, such as primary to tertiary amino groups, quaternary ammonium groups, pyridyl groups, imidazole groups or quaternary pyridinium groups. The above cationic polymer contains the cationic groups that have a strong nucleophilic action, traps water due to its hydrogen bond, and forms the moisture-absorbing matrix.

The amount of the cationic groups in the cationic polymer should be, usually, such that the percentage of water absorption (JIS K-7209-1984) of the moisture-absorbing matrix that is formed is not less than 20% and, specifically, 30% to 45% in an atmosphere of a humidity of 80% RH and a temperature of 30° C.

As the cationic polymer, further, there is used the one that is obtained by polymerizing or copolymerizing at least one kind of cationic monomers as represented by amine type monomers such as allylamine, ethyleneimine, vinylbenzyltrimethylamine, [4-(4-vinylphenyl)-methyl]-trimethylamine and vinylbenzyltriethylamine; nitrogen-containing heterocyclic monomers such as vinylpyridine and vinylimidazole; and salts thereof, together with other monomers copolymerizable therewith and, further as required, partly neutralizing the formed polymer with an acid.

As other monomers copolymerizable therewith, though not limited thereto only, there can be exemplified styrene, vinyltoluene, vinylxylene, α-methylstyrene, vinylnaphthalene, α-halogenated styrenes, acrylonitrile, acrolein, methyl vinyl ketone, and vinylbiphenyl.

Instead of using the above cationic monomers, it is also allowable to use a monomer having a functional group capable of introducing a cationic functional group, such as styrene, bromobutylstyrene, vinyitoluene, chloromethylstyrene, vinylpyridine, vinylimidazole, α-methylstyrene and vinylnaphthalene. After the polymerization thereof, the polymer thereof is subjected to the treatment such as amination or alkylation (chlorination with quaternary ammonium) to obtain a cationic polymer thereof.

In the invention, among the above-mentioned cationic polymers, the allylamine is particularly desired from the standpoint of film formability.

The polymerization for forming the cationic polymer is, usually, the radical polymerization based on the heating by using a polymerization initiator.

As the polymerization initiator, though not specifically limited, there can be represented organic peroxides such as octanoyl peroxide, lauroyl peroxide, t-butylperoxy-2-ethylhexanoate, benzoyl peroxide, t-butylperoxyisobutylate, t-butylperoxylaurate, t-hexylperoybenzoate and di-t-butyl peroxide. The polymerization initiator is, usually, used in an amount of 0.1 to 20 parts by weight and, specifically, about 0.5 to about 10 parts by weight per 100 parts by weight of the above-mentioned anionic or cationic monomer for monomer capable of introducing anionic groups or cationic groups).

The cationic polymer is obtained by conducting the polymerization as described above. Here, if there is used a monomer capable of introducing cationic functional groups, the treatment may be carried out for introducing cationic groups, such as amination or alkylation after the polymerization has been finished.

In the present invention, it is desired that a crosslinked structure has been introduced into the moisture-absorbing matrix formed by using the above cationic polymer from the standpoint of maintaining mechanical strength without lowering the moisture-absorbing capability and, at the same time, improving dimensional stability.

That is, with the crosslinked structure being introduced into the moisture-absorbing matrix, molecules of the cationic polymer are locked by each other due to the crosslinked structure in case the matrix has absorbed water. This suppresses a change in the volume caused by swelling (absorption of water) and brings about an improvement in the mechanical strength and in the dimensional stability.

The above crosslinked structure can be introduced by adding a crosslinking agent to the coating composition that forms the water-trapping layer 5. Depending on the kind of the crosslinking agent, e.g., by introducing the siloxane structure or the polyalicyclic structure into the crosslinked structure, there is formed a mesh structure having space adapted to absorbing moisture. Specifically, by using a crosslinking agent that introduces the siloxane structure, it is made possible to increase close adhesion to the first inorganic barrier layer 3. The crosslinking agent used here will be described later in the paragraph of the coating composition for forming the water-barrier layer using the cationic polymer as a matrix.

Moisture-Absorbing Matrix (Anionic Polymer)

In the invention, the anionic polymer used for forming the moisture-absorbing matrix is a polymer having in the molecules thereof anionic functional groups that could turn into a negative electric charge in water, such as carboxylic acid groups, sulfonic acid groups, phosphonic acid groups or acidic bases formed by the partial neutralization of these groups. The anionic polymer having these functional groups is capable of forming a moisture-absorbing matrix since the functional groups therein trap water due to their hydrogen bonds.

The amount of the anionic groups in the anionic polymer may differ depending on the kind of the functional groups but should be, usually, such that the percentage of water absorption (JIS K-7209-1984) of the moisture-absorbing matrix that is formed is not less than 20% and, specifically, 30% to 45% in an atmosphere of a humidity of 80% RH and a temperature of 30° C. like in the case of the cationic polymer mentioned above.

As the anionic polymer having the above functional groups, there is used the one that is obtained by polymerizing or copolymerizing at least one kind of the anionic monomers as represented by carboxylic acid type monomers such as methacrylic acid, acrylic acid and maleic anhydride; sulfonic acid type monomers such as α-halogenated vinylphosphonic acid, styrenesulfonic acid and vinylsulfonic acid; phosphonic acid type monomers such as vinylphosphoric acid and the like; and salts of these monomers, together with other monomers copolymerizable therewith and, further as required, partly neutralizing the formed polymer with an alkali.

As other monomers copolymerizable therewith, though not limited thereto only, there can be exemplified styrene, vinyltoluene, vinylxylene, α-methylstyrene, vinylnaphthalene, α-halogenated styrenes, acrylonitrile, acrolein, methyl vinyl ketone and vinylbiphenyl.

Instead of using the above anionic monomers, it is also allowable to use an ester of the above anionic monomer or a monomer having a functional group capable of introducing an anionic functional group, such as styrene, vinyitoluene, vinylxylene, α-methylstyrene, vinylnaphthalene or α-halogenated styrene. After the polymerization thereof, the polymer thereof is subjected to the treatment such as hydrolysis, sulfonation, chlorosulfonation or phosphoniation to obtain an anionic polymer thereof.

In the invention, preferred anionic polymers are a poly(meth)acrylic acid and a partly neutralized product thereof (e.g., the one which is partly an Na salt).

The polymerization for forming the anionic polymer is, usually, the radical polymerization based on the heating by using a polymerization initiator.

As the polymerization initiator, though not specifically limited, there can be represented organic peroxides such as octanoyl peroxide, lauroyl peroxide, t-butylperoxy-2-ethylhexanoate, benzoyl peroxide, t-butylperoxyisobutylate, t-butylperoxylaurate, t-hexylperoybenzoate and di-t-butyl peroxide. The polymerization initiator is, usually, used in an amount of 0.1 to 20 parts by weight and, specifically, about 0.5 to about 10 parts by weight per 100 parts by weight of the above-mentioned anionic monomer (or monomer capable of introducing anionic groups).

The anionic polymer is obtained by conducting the polymerization as described above. Here, if there is used a monomer capable of introducing anionic functional groups, the treatment may be carried out for introducing anionic groups, such as hydrolysis, sulfonation, chlorosulfonation or phosphoniation after the polymerization has been finished.

In the present invention, further, it is specifically desired to introduce the crosslinked structure into the moisture-absorbing matrix formed by using the above anionic polymer from the standpoint of further improving the moisture-absorbing capability and, at the same time, further improving dimensional stability.

That is, in the case of the anionic polymer unlike the case of the cationic polymer, water is trapped by the hydrogen bond only. Upon introducing, into the matrix, a mesh structure (crosslinked structure) having space adapted to absorbing moisture, therefore, it is made possible to greatly improve the moisture-absorbing property. The crosslinked structure has, for example, in the mesh structure, hydrophobic portion like the alicyclic structure, enabling the hydrophilic portions to exhibit further improved moisture-absorbing effect.

Further, by introducing the crosslinked structure into the moisture-absorbing matrix, molecules of the anionic polymer are locked by each other due to the crosslinked structure in case the matrix has absorbed water. This suppresses a change in the volume caused by swelling (absorption of water) and brings about an improvement in the dimensional stability. An improvement in the dimensional stability is the same as the one obtained with the cationic polymer described above.

Further, like in the case of the cationic polymer, the moisture-absorbing matrix is crosslinked by adding a crosslinking agent to the coating composition that forms the cationic water-trapping layer 5. The crosslinking agent used here will be described later in the paragraph of the coating composition for forming the water-barrier layer using the anionic polymer as a matrix.

The crosslinked structure can also be introduced into the matrix by adding a polyfunctional monomer such as divinylbenzene to the polymerizable monomer composition that forms the cationic polymer or the anionic polymer and, thereafter, polymerizing the polymerizable monomer composition. In this case, however, it becomes difficult to form the water-trapping layer 5 by using the coating composition that contains the ionic polymer (since the coating composition tends to be dispersed less homogeneously and becomes applicable less favorably).

Granular Moisture-Absorbing Agent.

In the invention, a granular moisture-absorbing agent has been dispersed in the water-trapping layer 5 in which the above-mentioned ionic polymer is forming a matrix (moisture-absorbing matrix). The moisture-absorbing agent is capable of attaining humidity to a degree lower than that of the ionic polymer (cationic or anionic polymer) that is forming the above moisture-absorbing matrix, and has a very high degree of moisture-absorbing capability. That is, the water-trapping layer 5 contains, dispersed therein, the moisture-absorbing agent that has a higher degree of moisture-absorbing property than that of the matrix. Therefore, water absorbed by the moisture-absorbing matrix is readily trapped by the moisture-absorbing agent and is effectively confined in the matrix.

As a result in the invention, water trapped by the water-trapping layer 5 is effectively suppressed from being released. Besides, the water-trapping layer 5 is capable of not only effectively absorbing moisture even in an atmosphere of a very low humidity but also effectively suppressing the moisture-absorbing matrix from swelling despite it has absorbed water.

The granular highly moisture-absorbing agent is preferably the one that can attain humidity to a degree which, is not higher than 6% in an environmental condition of a humidity of 80% RH and a temperature of 30° C. provided the humidity attained thereby is lower than that attained by the ionic polymer as described, for example, in Examples appearing later. If the humidity attained by the moisture-absorbing agent is higher than that attained by the ionic polymer, then water absorbed by the moisture-absorbing matrix cannot be sufficiently confined therein and may tend to escape; i.e., water-barrier property cannot be very improved. Further, despite the attained humidity is lower than that attained by the ionic polymer, if the attained humidity as measured under the above-mentioned conditions is higher than the above range, then water cannot be trapped to a sufficient degree in, for example, an atmosphere of a low humidity and the water-barrier capability may not be exhibited to a sufficient degree.

The granular moisture-absorbing agent, usually, has a percentage of water absorption (JIS K-7209-1984) of not less than 50% in an atmosphere of a humidity of 80% RH and a temperature of 30° C., and is the type of either inorganic or organic.

Examples of the inorganic moisture-absorbing agent include clay minerals such as zeolite, alumina, activated carbon or montmorillonite, calcium oxide and magnesium sulfide.

Examples of the organic moisture-absorbing agent include an anionic polymer and a partly neutralized crosslinked product thereof. The anionic polymer is the one obtained by polymerizing or copolymerizing, with other monomers, at least one kind of the anionic monomers as represented by carboxylic acid type monomer ((meth)acrylic acid or maleic anhydride), sulfonic acid type monomer (halogenated vinylsulfonic acid, styrenesulfonic acid or vinylsulfonic acid), phosphonic acid type monomer (vinylphosphoric acid) and salts of these monomers. In the use where transparency is required, in particular, the organic moisture-absorbing agent can be effectively used. A typical organic moisture-absorbing agent may comprise, for example, a fine granular crosslinked product of a monovalent metal salt of poly(meth)acrylic acid, such as crosslinked sodium poly(meth)acrylate or crosslinked potassium poly(meth)acrylate.

In the invention, it is desired that the moisture-absorbing agent has a small grain size (e.g., a mean primary grain size $D_{50}$ of not more than 100 nm and, specifically, not more than 80 nm) from the standpoint of gaining a large specific surface area and a high degree of moisture-absorbing property, and is, specifically, a moisture-absorbing agent of an organic polymer having a small grain size.

The moisture-absorbing agent which is the organic polymer is very favorably dispersible in the matrix of the ionic polymer and can, therefore, be homogeneously dispersed therein. Moreover, the moisture-absorbing agent can be produced by such a polymerization method as emulsion polymerization or suspension polymerization enabling it to be obtained in the form of a fine and neat spherical shape. By adding the moisture-absorbing agent in an amount larger than a certain ratio, it becomes possible to maintain a very high degree of transparency. The transparency is presumably realized due to that the spherical and finely granular moisture-absorbing agent is distributed in the form of a layer near the interface between the water-trapping layer and the neighboring layer (e.g., first inorganic barrier layer 3) and that light is suppressed from scattering in the interface. Specifically, assuring the transparency becomes a great advantage if the gas-barrier laminate 10 is used as a substrate or sealing layer of the organic EL panels or for sealing them.

Further, the organic finely granular moisture-absorbing agent is capable of attaining a very low humidity, has a high degree of moisture-absorbing property as described above, and changes very little in volume and does not swell due to its crosslinked structure. Therefore, the organic fine granular moisture-absorbing agent is best suited for lowering the humidity enabling the environmental atmosphere to be brought to the absolutely dry state or near to the absolutely dry state yet suppressing a change in the volume.

The above organic fine granular moisture-absorbing agent has been placed in the market in the trade name of TAFTIC HU-820E by Toyoboseki K. K. in the form of a colloidal dispersion solution (pH=10.4) in which are dispersed fine granular crosslinked sodium polyacrylate (mean grain size of about 70 nm).

As another preferred organic moisture-absorbing agent, there can be exemplified a fine granular organic moisture-absorbing agent comprising a crosslinked polymer having potassium salt type carboxyl groups of which not less than 80% of the carboxyl groups have been neutralized with a potassium salt. The moisture-absorbing agent of the potassium salt type does not release water it has absorbed even at high temperatures and, therefore, has excellent moisture-absorbing property at high temperatures.

The crosslinked polymer having the potassium salt type carboxyl group can be prepared by any one of (i) a method of homopolymerizing a potassium salt of a carboxyl group-containing vinyl monomer, such as (meth)acrylic acid or maleic acid, copolymerizing two or more kinds of these monomers, or copolymerizing these monomers with other monomers copolymerizable therewith, (ii) a method of obtaining a polymer having a carboxyl group and converting the polymer into a polymer of the potassium salt type, (iii) a method of introducing a carboxyl group by a chemical modification and converting the polymer into a polymer of the potassium salt type or (iv) a method of conducting any one of the above methods (i) to (iii) based on the graft polymerization. Specifically desirably, however, the potassium salt type crosslinked polymer having the carboxyl group is prepared by introducing the carboxyl group into the polymer by the hydrolyzing treatment of (iii) above and converting the polymer into a polymer of the potassium salt type by exchanging ions.

As the monomer to which the carboxyl group is introduced by the hydrolysis and which can be used for the method that executes the hydrolysis, there can be exemplified monomers having a cyano group, such as acrylonitrile and methacrylonitrile; and derivatives of acrylic acid, methacrylic acid, maleic acid, itaconic acid and vinylpropionic acid.

Further, as other monomers copolymerizable with the above monomers, there can be exemplified vinyl compounds that can be crosslinked, such as glycidylmethacrylate, N-methylolacrylamide, hydroxyethylmethacrylate, triallylisocyanulate, triallylcyanulate, divinylbenzene, ethylene glycol di(meth)acrylate, diethylene glycol di(meth)acrylate, triethylene glycol di(meth)acrylate, trimethylolpropanetri(meth)acrylate and methylenebisacrylamide.

It is further, desired that the monomer has a sulfonic acid group and/or a salt type sulfonic acid group as a polar group other than the potassium salt-type carboxyl group. As the monomer having the sulfonic acid (salt) group, there can be exemplified vinylsulfonic acid (salt thereof), (meth)allyisulfonic acid (salt thereof), styrenesulfonic acid (salt thereof), 4-sulfobutyl(meth)acrylate and salt thereof, methacryoxybenzenesulfonic acid (salt thereof), allyloxybenzenesulfonic acid (salt thereof), 2-acrylamide-2-methylpropanesulfonic acid (salt thereof), and 2-sulfoethyl(meth)acrylate. The sulfonic acid (salt) group can be introduced by copolymerizing the sulfonic acid (salt) group-containing monomer with the above-mentioned monomer, or by introducing the sulfonic acid (salt) group into the terminals of the polymer by using an initiator or a chain-transferring agent.

Concretely, a crosslinked copolymer that contains, as monomer composition, a monomer which forms the carboxyl group through the hydrolysis and a vinyl compound that can be crosslinked such as divinylbenzene, is hydrolyzed by using potassium hydroxide. As the moisture-absorbing agent, further, there can be preferably used a crosslinked polymer having a potassium salt type carboxyl group that is prepared by exchanging ions by using a solution that contains potassium ions in large amounts, such as an aqueous solution of potassium hydroxide or an aqueous solution of potassium chloride after having been converted into the carboxyl acid groups.

In the invention, the amount of the granular moisture-absorbing agent is determined depending on the kind of the ionic polymer such that properties thereof are exhibited to a full extent, water-barrier property is greatly improved, a dimensional change due to swelling is effectively suppressed, and water-barrier property of a level higher than the barrier property exhibited by the first inorganic barrier layer 3 is maintained over extended periods of time.

For instance, if the matrix is formed by using the cationic polymer, the granular moisture-absorbing agent is used in an amount of not less than 50 parts by weight, specifically, in an amount of 100 to 900 parts by weight and, more preferably, in an amount of 200 to 600 parts by weight per 100 parts by weight of the ionic polymer in the water-trapping layer 5. Further, if the matrix is formed by using the anionic polymer, the granular moisture-absorbing agent is used in an amount of not less than 50 parts by weight, specifically, in an amount of 100 to 1300 parts by weight and, more preferably, in an amount of 150 to 1200 parts by weight per 100 parts by weight of the anionic polymer in the water-trapping layer 5.

Coating Composition for Forming the Water-Trapping Layer 5.

The above-mentioned water-trapping layer 5 is formed by using a coating composition obtained by suitably dissolving or dispersing an ionic polymer, a granular moisture-absorbing agent and a crosslinking agent in a solvent, applying the composition, and drying the composition to remove the solvent therefrom.

The coating composition differs to some extent depending upon if the matrix is formed by using the cationic polymer (hereinafter simply referred to as "cationic matrix") or is formed by using the anionic polymer (hereinafter simply referred to as "anionic matrix").

In the Case of the Cationic Matrix.

The coating composition contains the cationic polymer and the granular moisture-absorbing agent at the above-mentioned ratio. Namely, the cationic polymer and the granular moisture-absorbing agent are contained in the coating composition in amounts mentioned above per 100 parts by weight of the cationic polymer.

The coating composition is, further, blended with a crosslinking agent to introduce the crosslinked structure into the moisture-absorbing matrix of the cationic polymer.

As the crosslinking agent in this case, there can be used a compound having a crosslinking functional group (e.g., epoxy group) capable of reacting with the cationic group and a functional group (e.g., alkoxysilyl group) capable of forming a siloxane structure in the crosslinked structure through the hydrolysis and dehydrating condensation. As the crosslinking agent, specifically, there can be favorably used a silane compound represented by the following formula (1):

$$X-SiR^1_n(OR^2)_{3-n} \quad (1)$$

wherein X is an organic group having an epoxy group at the terminal group thereof,
$R^1$ and $R^2$ are, independently, methyl groups, ethyl groups or isopropyl groups, and
n is 0, 1 or 2.

The silane compound of the formula (1) has an epoxy group and an alkoxysilyl group as functional groups, and the epoxy group undergoes the addition reaction with a functional group (e.g., $NH_2$) of the cationic polymer. On the other hand, the alkoxysilyl group forms a silanol group (SiOH group) through the hydrolysis, and grows by forming the siloxane structure through the condensation reaction to finally form a crosslinked structure among the cationic polymer chains. The crosslinked structure having the siloxane structure is thus introduced into the matrix of the cationic polymer. On the other hand, the silanol group formed by the hydrolysis of the alkoxysilyl group undergoes the dehydration•condensation with an MOH group (M: metal element), such as SiOH group (silanol group) present on the surface of the first inorganic barrier layer 3, and is firmly bonded thereto.

Besides, the coating composition contains the cationic polymer and is alkaline accelerating, therefore, the addition reaction of the cationic group with the epoxy group or the dehydration•condensation among the silanol groups or between the silanol group and the MOH group on the surface of the first inorganic barrier layer 3.

By using the compound of the above formula (1) as the crosslinking agent, therefore, it is made possible to introduce the crosslinked structure into the matrix and, at the same time, to improve adhesion between the water-trapping layer 5 and the first inorganic barrier layer 3 without using any particular adhesive agent.

As will be understood from the above description, with the siloxane structure being introduced into the crosslinked structure, it is also allowed, at the same time, to improve adhesiveness to the first inorganic barrier layer 3.

In the invention, the organic group X having the epoxy group in the above formula (1) can be represented by a γ-glycidoxyalkyl group. For instance, γ-glycidoxypropyltrimethoxysilane and γ-glycidoxypropylmethyldimethoxysilane can be favorably used as crosslinking agents.

Further, the compound of the above formula (1) in which the epoxy group is an alicyclic epoxy group such as epoxycyclohexyl group, too, can be favorably used as the crosslinking agent. For instance, if a compound having an alicyclic epoxy group such as β-(3,4)-epoxycyclohexyl) ethyltrimethoxysilane is used as the crosslinking agent, the siloxane structure as well as the alicyclic structure can be introduced into the crosslinked structure of the matrix. Introduction of the alicyclic structure helps more effectively to realize the function of the matrix which is to form the mesh structure having space adapted to absorbing moisture.

To introduce the alicyclic structure into the crosslinked structure, there can be used, as the crosslinking agent, a compound having a plurality of epoxy groups and alicyclic groups, e.g., a diglycidyl ester represented by, for example, the following formula (2):

$$G-O(C=O)-A-(C=O)O-G \quad (2)$$

wherein G is a glycidyl group, and
A is a divalent hydrocarbon group having an aliphatic ring, such as cycloalkylene group.

Representative examples of the diglycidyl ester are expressed by the following formula (2-1).

[Chemical 1]

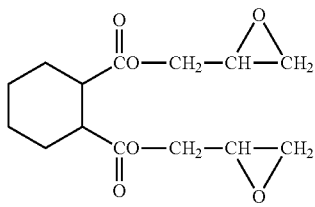

(2-1)

The diglycidyl ester of the formula (2) has no alkoxysilyl group and hence has a function which is not sufficient for improving adhesion to the first inorganic barrier layer 3. It, however, introduces the alicyclic structure into the crosslinked structure and is effective from the standpoint of forming, in the matrix, a mesh structure having space adapted to absorbing moisture.

In the coating composition forming the cationic matrix, it is desired that the crosslinking agent is used in an amount of 5 to 60 parts by weight and, specifically, 15 to 50 parts by weight per 100 parts by weight of the cationic polymer and that at least not less than 70% by weight and, preferably, not less than 80% by weight of the crosslinking agent is the silane compound of the formula (1) described above.

If the crosslinking agent is used in too large amounts, the matrix becomes brittle in terms of the mechanical strength and less easy to handle. If prepared in the form of a coating material, the composition quickly becomes so viscous that a sufficiently long pot life cannot be insured. If the crosslinking agent is used in too small amounts, on the other hand, it may become difficult to maintain the resistance (e.g., mechanical strength) in a severe environment (e.g., under highly humid conditions). Further, if the silane compound of the above formula (1) is used at a small ratio, the adhesiveness to the first inorganic barrier layer 3 tends to decrease.

Any solvent can be used without limitation for the coating composition that contains the above-mentioned components provided it can be volatilized and removed upon being heated at a relatively low temperature. For instance, there can be used an alcoholic solvent such as methanol, ethanol, propyl alcohol or butanol; ketone solvent such as acetone or methyl ethyl ketone; a mixed solvent of the above solvents and water; water, or an aromatic hydrocarbon solvent such as benzene, toluene or xylene. Specifically, it is desired to use water or a mixed solvent containing water to accelerate the hydrolysis of the silane compound having alkoxysilyl group in the crosslinking agent in the coating composition.

The above solvent is used in such an amount that the coating composition assumes a viscosity suited for being applied. Here, however, it is also allowable to add a non-ionic polymer in a suitable amount to adjust the viscosity of the coating composition or to adjust the percentage of water absorption of the formed moisture-absorbing matrix to lie in a suitable range.

As the non-ionic polymer, there can be exemplified saturated aliphatic hydrocarbon polymers such as polyvinyl alcohol, ethylene-propylene copolymer and polybutylene; styrene type polymers such as styrene-butadiene copolymer, etc.; polyvinyl chloride; and those obtained by copolymerizing the above polymers with various comonomers (e.g., styrene type monomers such as vinyltoluene, vinyixylene, chlorostyrene, chloromethylstyrene, α-methylstyrene, α-halogenated styrene and α,β,β'-trihalogenated styrene; monoolefins such as ethylene and butylene; or conjugated diolefins such as butadiene and isoprene).

In the Case of the Anionic Matrix.

The coating composition for forming the water-trapping layer 5, in this case, contains the anionic polymer and the granular moisture-absorbing agent in such amounts that the amount of the granular moisture-absorbing agent lies in the above-mentioned range relative to 100 parts by weight of the anionic polymer.

The coating composition in this case, too, is suitably blended with the crosslinking agent like in the case of the above-mentioned cationic matrix.

As the crosslinking agent, there can be used a compound having two or more crosslinking functional groups (e.g., epoxy groups) capable of reacting with the ionic groups possessed by the anionic polymer. Namely, there can be used the diglycidyl ester represented by the formula (2):

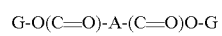

(2)

wherein G is a glycidyl group, and
A is a divalent hydrocarbon group having an aliphatic ring, such as cycloalkylene group, that was also exemplified for the coating composition for forming the cationic matrix.

In the diglycidyl ester of the above formula (2), the epoxy group reacts with the anionic group, and a crosslinked structure that includes an alicyclic structure due to the divalent group A is formed in the matrix. The crosslinked structure that includes the alicyclic structure suppresses the layer from swelling.

Among the above diglycidyl esters, preferred examples have already been quoted above, and the most desired example is a diglycidyl ester represented by the following formula (2-1) from the standpoint of forming the mesh structure having space adapted to absorbing the moisture.

[Chemical 2]

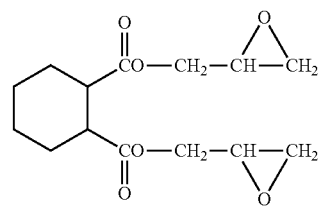

(2-1)

It is desired that the coating composition for forming the anionic matrix contains the crosslinking agent in an amount of 1 to 50 parts by weight and, specifically, 10 to 40 parts by weight per 100 parts by weight of the anionic polymer. If the crosslinking agent is used in too large amounts, the matrix becomes brittle in terms of the mechanical strength and less easy to handle. If prepared in the form of a coating material, the composition quickly becomes so viscous that a sufficiently long pot life cannot be insured. If the crosslinking agent is used in too small amounts, on the other hand, it may become difficult to maintain the resistance (e.g., mechanical strength) in severe environments (e.g., under highly humid conditions).

Further, the coating composition can be blended with an adhesive agent to improve the adhesiveness between the water-trapping layer 5 and the first inorganic barrier layer 3.

The adhesive agent has functional groups that are reactive with the surface of the first inorganic barrier layer 3 and with the matrix of the anionic polymer, i.e., has, for example, an epoxy group and an alkoxysilyl group. The coating composition for forming the cationic; matrix, preferably, uses a silane compound that also works as the crosslinking agent.

The silane compound is represented by the above-mentioned formula (1):

wherein X is an organic group having an epoxy group,
$R^1$ and $R^2$ are, independently, methyl groups, ethyl groups or isopropyl groups, and
n is 0, 1 or 2.

That is, as described earlier, the silanol group (SiOH group) formed by the hydrolysis of the alkoxysilyl group undergoes the hydration/condensation with MOH (M is a metal element forming the inorganic barrier layer and is, for example, Si) that is distributed in the surface of the first inorganic barrier layer 3. Therefore, the siloxane structure is introduced into the matrix, and the adhesive agent (silane compound) bonds closely to the surface of the first inorganic barrier layer 3. Further, the epoxy group reacts (esterifies) with an acid group (e.g., COOH) or a salt thereof (e.g., COONa) possessed by the anionic polymer (a), and bonds thereto. Therefore, the adhesive agent also bonds to the matrix of the water-trapping layer 5. The adhesive agent thus improves adhesiveness between the first inorganic barrier layer 3 and the water-trapping layer 5, and improves the junction strength thereof. Accordingly, the water-trapping layer 5 is effectively prevented from peeling, and water-barrier property of a high degree is maintained over long periods of time.

Specifically, if the first inorganic barrier layer 3 is a film formed by vapor-depositing an organosilicon compound by the plasma CVD method, the SiOH groups are distributed in the surface thereof enabling the siloxane bond to be easily formed between the water-trapping layer 5 (matrix) and the inorganic barrier layer 3 and, therefore, very greatly improving the adhesiveness therebetween.

Among the silane compounds of the above formula (1), preferred are those having a plurality of alkoxysilyl groups (n is 0 or 1 in the formula (1)), such as γ-glycidoxypropyltrimethoxysilane and γ-glycidoxypropylmethyldimethoxysilane. Further, what is most desired as the adhesive agent is the one of which the epoxy group is an alicyclic epoxy group such as epoxycyclohexyl group, e.g., β-(3,4-epoycyclohexyl)ethyltimethoxysilane and the like.

In the present invention, it is desired that the adhesive agent is made present in an amount of 0.1 to 10 parts by weight and, specifically, 1 to 8 parts by weight per 100 pars by weight of the anionic polymer in the water-trapping layer 5 so that its properties are fully exhibited without impairing the water-barrier property.

Any solvent can be used without limitation for the coating composition that contains the above-mentioned components provided it can be volatilized and removed upon being heated at a relatively low temperature. For instance, there can be used those of the same kind as those exemplified for the coating composition for forming cationic matrix. Specifically, if the silane compound having the alkoxysilyl group like the compound of the above formula (1) is used as the adhesive agent, it is desired to use a solvent that contains at least water. This is because it accelerates the hydrolysis of the alkoxysilyl group and heightens the function as the crosslinking agent or the adhesive agent.

Further, an alkali (e.g., sodium hydroxide, etc.) can be added to the coating composition for forming the anionic matrix to adjust the pH thereof. Addition of the alkali is effective in accelerating the dehydration/condensation of the silanol group formed from the silane compound used as the adhesive agent with the MOH group in the surface of the inorganic barrier layer 3. The alkali should be so added that the pH is, for example, about 8 to about 12.

Like in the case of the coating composition for forming the cationic matrix, the solvent is used in such an amount that the coating composition assumes a viscosity adapted for being applied. It is, further, allowable to add the above-mentioned non-ionic polymer in a suitable amount in order to adjust the viscosity of the coating composition or to adjust the percentage of water absorption of the formed moisture-absorbing matrix to lie in a suitable range.

Forming the Water-Trapping Layer 5.

The water-trapping layer 5 is formed by using the coating composition for forming the cationic matrix or the anionic matrix. Namely, the coating composition is applied onto the surface of the first inorganic harrier layer 3 and is heated at a temperature of about 80 to about 160° C. The heating time varies depending on the ability of the heating device such as heating oven but is, usually, from several seconds to several minutes. Due to the heating, the solvent is removed, the crosslinking agent reacts with the ionic polymer and the MOH in the surface of the first inorganic barrier layer 3, and the crosslinked structure is introduced into the matrix to form the water-trapping layer 5 that is excellently adhered to the first inorganic barrier layer 3.

The thickness of the water-trapping layer 5 is free from any particular limitation and can be suitably set depending on the use or the required degree of water-barrier property. Usually, however, the thickness of at least not less than 1 μm and, specifically, about 2 to about 20 μm is sufficient for exhibiting a very high degree of barrier property so that the water vapor permeability is not more than $10^{-5}$ g/m²/day.

Namely, in the invention, the water-trapping layer 5 has double functions of absorbing moisture and confining moisture. Therefore, by forming a single water-trapping layer 5 in a suitable thickness on the first inorganic barrier layer 3, it is allowed to exhibit a very high degree of barrier property against water as described above. In the invention, therefore, a high degree of barrier property is obtained with a decreased number of layers offering a great advantage from the standpoint of productivity and cost of production.

<Organic Layer 7>

In the gas-barrier laminate 10 of the present invention, the organic layer 7 formed on the water-trapping layer 5 serves as an underlying layer for the second inorganic barrier layer 9 that is formed thereon. If the second inorganic barrier layer 9 is directly formed on the water-trapping layer 5 without providing the organic layer 7, then a sufficient degree of adhesiveness cannot be maintained between the second inorganic barrier layer 9 and the water-trapping layer 5. Namely, inconvenience develops, such as easy occurrence of delamination and a decrease in the adhesiveness between the second inorganic barrier layer 9 and the water-trapping layer 5 due to a slight change in the volume as a result of having absorbed moisture with the passage of time. The above inconvenience, however, can be effectively avoided by the provision of the organic layer 7 that serves as the underlying layer between the above two layers.

The organic layer 7 can be formed by using any resin provided it is capable of forming a film having a smooth surface and a property of not absorbing moisture (e.g., having a percentage of water absorption (80% RH, 30° C.)

of not more than 1.0%) and is capable of maintaining a highly adhering force (e.g., not less than 1.0 N/15 mm) to the water-trapping layer 5. Usually, however, it is desired that the organic layer 7 is formed by using a resin having a glass transition point (Tg) of not lower than 60° C. from the standpoint of preventing the thermal deformation of the second inorganic barrier layer 9 of when it is being formed and that the organic layer 7 itself can be easily formed by being applied.

As the resin for forming the organic layer 7, from the above point of view, there can be exemplified polyester resin, cycloolefin resin, (meth)acrylic resin and halogen resin, and from which is selected a resin having a high glass transition point (Tg) as described above.

Representative examples of the polyester resin include polyethylene terephthalate (PET), polybutylene terephthalate and polyethylene naphthalate, and all of which may contain a copolymer unit.

Representative examples of the dibasic acid component in the copolymer unit include aromatic dicarboxylic acids such as isophthalic acid, phthalic acid and naphthalenedicarboxylic acid; and alicyclic dicaroxylic acids such as cyclohexanedicarboxylic acid and the like acid; aliphatic dicarboxylic acids such as succinic acid, adipic acid, sebacic acid and dodecanedioic acid. As the diol component, further, there can be exemplified propylene glycol, 1,4-butanediol, diethylene glycol, 1,6-hexylene glycol, cyclohexanedimethanol and ethylene oxide adduct of bisphenol A, which can be used in one kind or in two or more kinds.

As the cycloolefin resin, further, there can be exemplified a polycyclohexene derived from the cyclohexene, as well as those derived from the olefin (polycyclic olefin) having a bicyclo ring with a crosslinked group (e.g., methylene group or ethylene group) in the cyclohexane ring or having a polycyclic structure in which an aliphatic ring is further bonded to the bicyclo ring.

As the polycyclic olefin, there can be exemplified those having a bicyclo-ring structure represented by the following formula (3):

[Chemical 3]

(3)

wherein Z is a methylene group or an ethylene group.

Described below are concrete examples of the polycyclic olefin though not limited thereto only.

[Chemical 4]

Bicyclo[2.2.1]hepto-2-en

[Chemical 5]

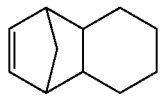

Tricyclo[4.4.0.1$^{2.5}$]-3-undecene

[Chemical 6]

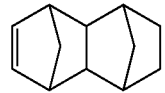

Tetracyclo[4.4.0.1$^{2.5}$.1$^{7,10}$]-3-dodecene

[Chemical 7]

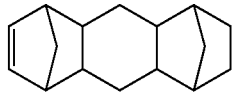

Pentacyclo[8.4.0.1$^{2.5}$.1$^{9,12}$.0$^{8,13}$]-3-hexadecene

[Chemical 8]

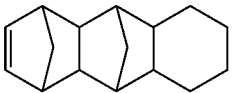

Pentacyclo[6.6.1.1$^{3,6}$.0$^{2,7}$.0$^{9,14}$]-4-hexadecene

As the (meth)acrylic resin, further, there can be exemplified those obtained by polymerizing the following mono (meth)acrylate monomers and polyfunctional(meth)acrylate monomers in one kind or in a combination of two or more kinds.

1. Mono(meth)acrylate monomers;
   methyl(meth)acrylate,
   ethyl(meth)acrylate,
   glycidyl(meth)acrylate,
   2-cyanomethyl(meth)acrylate,
   benzyl(meth)acrylate,
   polyethylene glycol mono(meth)acrylate,
   allyl(meth)acrylate,
   2-hydroxyethyl(meth)acrylate,
   3-hydroxypropyl(meth)acrylate,
   glycerylmono(meth)acrylate, and
   2-(meth)acryloxyethylacetyl acetate.

2. Polyfunctional(meth)acrylate monomers;
   ethylene glycol di(meth)acrylate,
   diethylene glycol di(meth)acrylate,
   triethylene glycol di(meth)acrylate,
   nonaethylene glycol di(meth)acrylate,
   propylene glycol di(meth)acrylate,
   dipropylene glycol di(meth)acrylate,
   2,2'-bis[4-(meth)acryloyloxyethoxyphenyl]propane,
   2,2'-bis[4-(meth)acryloyloxyethoxyethoxy phenyl]propane,
   2,2'-bis{4-[3-(meth)acryloyloxy-2-hydroxy propoxy] phenyl}propane,
   1,4-butanedioldi(meth)acrylate,
   1,6-hexanedioldi(meth)acrylate,
   trimethylolpropanetri(meth)acrylate,
   urethane(meth)acrylate, and
   epoxy(meth)acrylate.

In addition to the above, there can be used polymers obtained by, for example, polymerizing a long-chain alkyl ester (e.g. having not less than 3 carbon atoms) of a (meth)acrylic acid. However, the polymers of this kind have considerably low glass transition points (Tg) and are, usually, used in the form of a copolymer with a polyfunctional (meth)acrylate.

As the halogen resin, there can be exemplified vinyl chloride resin, vinylidene chloride resin, chlorinated vinyl chloride resin, tetrafluorined resin (polytetrafluoroethylene), vinylidene fluoride resin, chlorotrifluoroethylene resin (PCTFE), vinyl fluoride resin (PVF), perfluoroalkoxyfluorine resin (PFA), ethylne.ethylene tetrafluoride copolymer resin (ETFE), and ethylene.chlorotrifluoroethylene copolymer resin (ECTFE).

In the present invention, the organic layer 7 is formed by dissolving the above-mentioned resins in a volatile organic solvent, and applying the thus prepared coating solution onto the water-trapping layer 5 followed by drying. The organic layer 7 can be also formed by separately forming a film or a sheet that corresponds to the organic layer 7, and sticking the film or the sheet by using a suitable adhesive onto the water-trapping layer 5 by dry lamination.

Irrespective of by which method the organic layer 7 is to be formed, it is desired that the water-trapping layer 5 is formed on the first inorganic barrier layer 3 and, thereafter, the operation is continued to form the organic layer 7. This is because as the water-trapping layer 5 continues to be exposed in the atmosphere for extended periods of time, its activity decreases due to the absorption of moisture.

The organic layer 7 should have a thickness to such a degree that a rough surface or a very small change in the volume of the water-trapping layer 5 as a result of absorbing moisture will not be reflected in the surface of the organic layer 7. An unnecessarily increased thickness, however, simply results in disadvantage in economy. By taking the above respects into account, the thickness of the organic layer 7 is, usually, set to be about 1 to about 200 μm and, specifically, about 2 to about 100 μm.

<Second Inorganic Barrier Layer 9>

The second inorganic barrier layer 9 formed on the organic layer 7 which is the underlying layer works to suppress the water from infiltrating into the water-trapping layer 5 as much as possible and to suppress the loss of activity of the water-trapping layer 5 caused by the absorption of moisture. That is, without the second inorganic barrier layer 9, the water-trapping layer 5 might lose its activity upon absorbing moisture in a stage of before being sold and put to use, such as during the production or while being transited. At the time of practical use, further, an excess of water could be trapped by the water-trapping layer 5 which, therefore, cannot maintain its excellent moisture-absorbing property over extended periods of time. By forming the second inorganic barrier layer 9 on the organic layer 7, therefore, the above inconvenience can be effectively avoided.

The second inorganic barrier layer 9 may be quite the same as the first inorganic barrier layer 3 that was described above.

Here, however, the second inorganic barrier layer 9 is provided so that an excess of water will not infiltrate into the water-trapping layer 5. Besides, the water-trapping layer 5 by itself exhibits very excellent water-barrier property even as compared to the second inorganic barrier layer 9. Therefore, in order for the gas-barrier laminate 10 as a whole to secure a high level of water-barrier property, the second inorganic barrier layer 9 needs have a certain degree of water-barrier property but does not have to possess water-barrier property of a level as high as that of the first inorganic barrier layer 3; i.e., the second inorganic barrier layer 9 may have water-barrier property of a level lower than that of the first inorganic barrier layer 3. As described earlier, it is desired that the first inorganic barrier layer 3 has a water vapor permeability of not more than $10^{-2}$ g/m²/day and, specifically, not more than 10 g/m². In this case, the water vapor permeability of the second inorganic harrier layer 9 may be larger than the water vapor permeability of the first inorganic barrier layer 3. The second inorganic barrier layer 9 having a water vapor permeability of not larger than about $10^{-1}$ g/m²/day is sufficient for achieving the object of the present invention which is to suppress the loss of activity of the water-trapping layer 5.

As described above, further, the second inorganic barrier layer 9 that may have a water vapor permeability larger than that of the first inorganic barrier layer 3, means that it can be formed under mild conditions by the CVD of a low output and, further, that it can be formed in a short period of time and in a thickness smaller than that of the first inorganic barrier layer 3. For instance, the second inorganic barrier layer 9 can have a thickness which is not more than 70% and, specifically, 50 to 60% of the thickness of the first inorganic barrier layer 3 offering a great advantage in productivity and cost of production.

Further, the second inorganic layer 9 may be formed in advance on one surface of the film or the sheet that corresponds to the organic layer 7, and may then be stuck onto the water trapping layer 5 by dry lamination using a suitable adhesive to thereby form the organic layer 7 and the second inorganic layer 9. Moreover, a suitable adhesive layer for dry lamination may be used as the organic layer 7, and a film or a sheet forming the second inorganic layer 9 in advance may be stuck thereon with the inorganic layer 9 on the side of the adhesive layer.

<Other Layers>

In the invention, there is no need of providing any particular layer on the above second inorganic barrier layer 9. It is, however, also allowable to form any known layer that has heretofore been formed for the gas-barrier laminates of this kind in a range in which it does not impair the advantage of the present invention.

For example, there can be formed a water-repellent layer such as olefin resin layer in order to reliably prevent the release of water from the water-trapping layer 5 and to avoid a decrease in the electric insulation caused by water that is released.

In order to further improve barrier property against oxygen, there can be provided an oxygen-barrier layer comprising an ethylene-vinyl alcohol copolymer or aromatic polyamide, or an oxygen-absorbing layer that contains a transition metal such as iron, cobalt or the like.

The above-mentioned layers can be easily formed by known means, such as co-extrusion, coating or the like method.

<Use>

The gas-barrier laminate 10 of the present invention includes the water-trapping layer 5 that exhibits very excellent water-trapping capability, that effectively suppresses the loss of its activity, that not only maintains its water-barrier property over extended periods of time but also prevents a change in the size thereof caused as it absorbs moisture, effectively avoids a decrease in the adhesiveness (that causes a decrease in the barrier property) caused by a change in the size, and realizes such a very excellent water-barrier property as a water vapor permeability of not more than $10^{-5}$ g/m²/day with a small number of layers.

Therefore, the gas-barrier laminate 10 can be favorably used as a film for sealing electronic circuits of various kinds of electronic devices such as organic EL devices, solar cells and e-papers. Further, if there is used a plastic film material 1 having excellent transparency such as PET, PEN, polycarbonate or polyimide resin, it is allowed to form transparent electrodes thereon and to form, thereon, an organic EL device having a luminous layer or a photovoltaic device of a solar cell.

EXAMPLES

Excellent properties of the gas-barrier laminate of the invention will now be described below by way of Examples.

In the following, Examples 1 to 10 and 14 were the cases where the matrix in the water-trapping layer was formed by using a cationic polymer (polyallylamine) while Examples 11 to 13 were the cases where the matrix in the water-trapping layer was formed by using an anionic polymer (polyacrylic acid).

In these Examples, further, measurements were taken by the methods described below.

<Evaluating the Attained Humidity>

The material was dried at 140° C. for one hour. 0.5 Grams of the material to be measured and a wireless thermometer/hygrometer (Hygroclone, manufactured by KN Laboratories Co.) were put into a cup of a water-impermeable steel-foiled laminate having a volume of 85 cm$^3$ in an atmosphere of 30° C. 80% RH. The mouth of the container was heat-sealed with a lid of an aluminum foil-laminated film. After left to stand at 30° C. for one day, the relative humidity in the container was regarded as the attained humidity.

<Measuring the Water Vapor Permeability (g/m$^2$/day)>

In compliance with the method described in JP-A-2010-296285, measurement was taken as describe below.

By using a vacuum evaporation apparatus (JEE-400 manufactured by Nihon Denshi Co.), a thin Ca film (thin film of a metal that corrodes with water) was formed by vacuum evaporation in a thickness of 300 nm on the surface of the inorganic barrier layer of the sample gas-barrier laminate. Further, an Al film (water-impermeable thin metal layer) was vapor-deposited in a thickness of 540 nm so as to cover the thin Ca film to thereby prepare a sample piece.

Here, the thin Ca film was vapor-deposited in a circular shape 1 mm in diameter on six places by using metal calcium as a source of vacuum evaporation and by using a predetermined mask. Thereafter, the mask was taken away in a vacuum state, and Al was vapor-deposited thereon from an Al vacuum evaporation source in the apparatus.

The thus formed sample was placed in a gas-impermeable cup filled with the silica gel (moisture absorbing capability of 300 mg/g) as the moisture-absorbing agent, and was fixed therein by using a fixing ring to prepare a unit for evaluation.

The thus prepared unit for evaluation was held in an air-conditioned vessel adjusted to an atmosphere of 40° C. 90% for 520 to 720 hours. Thereafter, by using a laser microscope (laser scan microscope manufactured by Carl Zeiss Co.), the thin Ca film of the sample was observed for its state of corrosion, and the water vapor permeability was calculated from the amount of the metal calcium that was corroded. The samples having the water vapor permeability of not more than 10$^{-5}$ g/m$^2$/day were evaluated to be ⊚, the samples having the water vapor permeability of not less than 10$^{-5}$ g/m$^2$/day but less than 10$^{-3}$ g/m$^2$/day were evaluated to be ○, and the samples having the water vapor permeability of about 10$^{-3}$ g/m$^2$/day were evaluated to be ×.

<Measuring the Percentage of Water Content>

Percentage of water content of the water-trapping layer of the gas-barrier laminate was found according to the procedure described below.

The sample gas-barrier laminates were prepared and were left to stand in an atmosphere of 22° C. 60% RH for 12 hours. Thereafter, the samples were measured for their percentage of water content by using an apparatus for measuring trace amounts of water (Model CA-06, manufactured by Mitsubishi Kagaku Co.).

Figure 3:
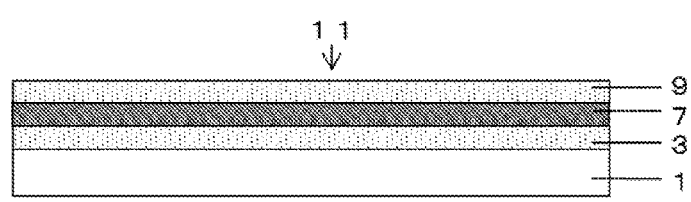
FIG. 3 is a sectional view schematically illustrating the structure of layers of a blank sample prepared for measuring the percentage of water content.

As a blank, further, a laminate 11 was prepared in a structure without the water-trapping layer 5 as shown in FIG. 3 and was similarly measured for its percentage of water content.

Percentage of water content of the water-trapping layer 5 was calculated by subtracting the percentage of water content of the blank from the percentage of water content of the sample that was measured. The samples having percentages of water content of not more than 5% were evaluated to be ○ and the samples having percentages of water content in excess of 5% were evaluated to be ×.

<Strength of Close Adhesion>

Aluminum foils of a thickness of 7 μm were dry-laminated on both surfaces of the sample gas-barrier laminate via urethane adhesive layers of a thickness of 4 μm. To cure the adhesive layers, the sample laminate was aged at 50° C. for 3 days to thereby prepare a sample for T-peel testing.

The sample for T-peel testing was cut into a strip measuring 100 mm×15 mm. By using a tensile testing machine, the strip was tested for its T-peeling at a tension speed of 300 mm/min. (N=3). The average strength was regarded to be a strength of close adhesion, and the samples of not less than 1.0 (N/15 mm) were evaluated to be ○, and those of less than 1.0 (N/15 mm) were evaluated to be ×.

<Preparation of Polyethylene Terephthalate (PET) Films Coated with the First Inorganic Barrier Layer 3>

By using a plasma CVD apparatus, an inorganic barrier layer 3 of silicon oxide was formed on one surface of a biaxially stretched PET film 1 having a thickness of 100 μm. Described below were the conditions for preparing the film.

There was used a CVD apparatus equipped with a high-frequency output power source of a frequency of 27.12 MHz and a maximum output of 2 kW, a matching box, a metallic cylindrical plasma-treating chamber of a diameter of 300 mm and a height of 450 mm, and a hydraulic rotary vacuum pump for evacuating the treating chamber. A plastic base member was placed on flat parallel plates in the treating chamber, a hexamethyldisiloxane was introduced at a rate of 3 sccm, oxygen was introduced at a rate of 45 sccm, and a 50-watt high-frequency output was generated by the high-frequency oscillator for 2 seconds to form a closely adhered layer. Next, a 200-watt high-frequency output was generated by the high-frequency oscillator for 100 seconds to form a barrier layer. The thus obtained inorganic barrier layer-coated PET film exhibited a water vapor permeability of 1 to 3×10$^{-3}$ g/m$^2$/day as measured in an atmosphere of 40° C. 90% RH.

<Preparation of the Second Inorganic Barrier Layer 9>

By using a plasma CVD apparatus, an inorganic barrier layer 9 of silicon oxide was formed on an organic layer 7. Described below were the conditions for preparing the film.

There was used a CVD apparatus equipped with a high-frequency output power source of a frequency of 27.12 MHz and a maximum output of 2 kW, a matching box, a metallic cylindrical plasma-treating chamber of a diameter of 300 mm and a height of 450 mm, and a hydraulic rotary vacuum pump for evacuating the treating chamber. A plastic base member was placed on flat parallel plates in the treating chamber, a hexamethyldisiloxane was introduced at a rate of 3 sccm, oxygen was introduced at a rate of 45 sccm, and a 50-watt high-frequency output was generated by the high-frequency oscillator for 2 seconds to form a closely adhered layer. Next, a 100-watt high-frequency output was generated by the high-frequency oscillator for 50 seconds to form an inorganic barrier layer 9 that exhibited a water vapor permeability of 1 to 2×10$^{-1}$ g/m$^2$/day as measured in an atmosphere of 40° C. 90% RH.

<Experiment 1>

A polymer solution was obtained by diluting, as the ionic polymer, a polyallylamine (PAA-15C, aqueous solution containing 15% of solid component, manufactured by Nittobo Medical Co.) with water such that the solid component was 5% by weight. On the other hand, a solution of the crosslinking agent was prepared by dissolving a γ-glycidoxypropyltrimethoxysilane, as the crosslinking agent, in water such that the amount thereof was 5% by weight. Next, the polymer solution and the solution of the crosslinking agent were mixed together such that the amount of the γ-glycidoxypropyltrimethoxysilane was 15 parts by weight per 100 parts by weight of the polyallylamine. To the mixed solution was, further, added, as the granular moisture-absorbing agent, a crosslinked product of Na polyacrylate (TAFTIC HU-820E, aqueous dispersion containing 13% of solid component, average grain size ($D_{50}$), 70 nm, manufactured by Toyobo Co.) in an amount of 400 parts by weight with respect to the polyallylamine, and to which was, further, added water such that the amount of the solid component was 5%. The mixture was stirred well to obtain a coating solution A for forming the water-trapping layer.

By using a bar coater, the above coating solution A was applied onto the vapor-deposited surface of the inorganic barrier layer 3-coated PET film that has been prepared in advance. The film after applied with the coating solution was heat-treated in a box-type electric oven under the conditions of a peak temperature of 120° C. and a peak temperature-holding time of 10 seconds. There was formed the water-trapping layer 5 of a thickness of 4 μm to obtained, a coating film A.

A coating solution B for forming an organic layer was prepared by dissolving a polyester resin (VYLON GK880 manufactured by Toyobo Co.) in a 2-butanone such that the amount of the solid component was 10% by weight.

By using the bar coater, the above coating solution B was applied onto the water-trapping layer 5 of the coating film A obtained above immediately after the water-trapping layer has been formed. The film after applied with the coating solution was heat-treated in the box-type electric oven under the conditions of a peak temperature of 120° C. and a peak temperature-holding time of 10 seconds. There was formed the organic layer 7 of a thickness of 4 μm to obtained the coating film B.

Next, by using the plasma CVD apparatus, an inorganic barrier layer 9 was quickly formed on the organic layer 7 of the coating film B. There was obtained a gas-barrier laminate 10 of a layer structure as shown in FIG. 2.

Example 2

A gas-barrier laminate 10 was obtained in the same manner as in Example 1 but using a cycloolefin type resin (TOPAS 8007 manufactured by Polyplastics Co.) as the resin of the coating solution B for forming the organic layer and using toluene as the solvent.

Example 3

A gas-barrier laminate 10 was obtained in the same manner as in Example 1 but using an acrylic resin (Sumipex LG 35 manufactured by Sumitomo Kagaku Co.) as the resin of the coating solution B for forming the organic layer and using toluene as the solvent.

Example 4

A gas-barrier laminate 10 was obtained in the same manner as in Example 1 but using a polyvinyl chloride (polymerization degree=1100, manufactured by Wako-Junyaku Kogyo Co.) as the resin of the coating solution B for forming the organic layer and using tetrahydrofuran as the solvent.

Example 5

Figure 4:
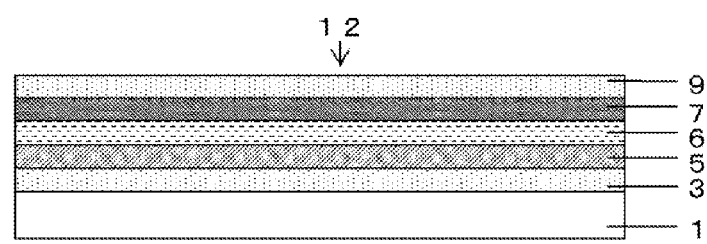
FIG. 4 is a sectional view schematically illustrating the structure of layers of a gas-barrier laminate fabricated in Examples 5 and 7.

A coating film A was formed in the same manner as in Example 1, and was quickly transferred into a gloved box in which the nitrogen concentration has been adjusted to be not less than 99.95%. The PET film of a thickness of 12 μm that corresponds to the thickness of the organic layer 7 and having the inorganic barrier layer 9 formed on one surface thereof, was dry-laminated on the water-trapping layer 5 of the coating film A via the urethane type adhesive layer 6 of a thickness of 4 μm in a manner that the inorganic barrier layer 9 was on the outer side. In order to cure the adhesive resin layer so will not to absorb moisture, the laminate was aged in vacuum at 50° C. for 3 days. There was obtained a gas-harrier laminate 12 of a layer structure as shown in FIG. 4.

Example 6

Figure 5:
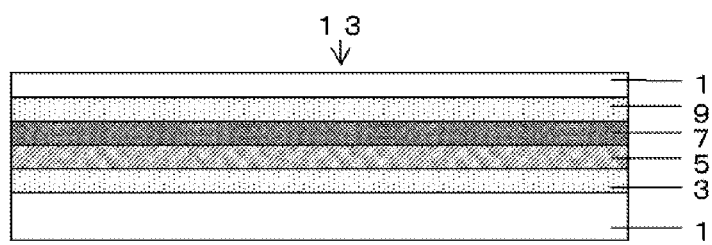
FIG. 5 is a sectional view schematically illustrating the structure of layers of a gas-barrier laminate fabricated in Examples 6 and 8.

A coating film A was formed in the same manner as in Example 1, and was quickly transferred into the gloved box in which the nitrogen concentration has been adjusted to be not less than 99.95%. The PET film of a thickness of 12 μm and having the inorganic barrier layer 9 formed on one surface thereof, was dry-laminated on the water-trapping layer 5 of the coating film A via the urethane type adhesive layer of a thickness of 4 μm as the organic layer 7 in a manner that the inorganic barrier layer 9 was in contact with the organic layer 7. In order to cure the adhesive resin layer so will not to absorb moisture, the laminate was aged in vacuum at 50° C. for 3 days. There was obtained a gas-barrier laminate 13 of a layer structure as shown in FIG. 5.

Example 7

A gas-barrier laminate 12 was obtained in the same manner as in Example 5 but using a commercially available barrier PET film (GX film manufactured by Toppan Insatsu Co.) instead of using the 12 μm-thick PET film having the inorganic barrier layer 9 formed on one surface thereof.

Example 8

A gas-barrier laminate 13 was obtained in the same manner as in Example 6 but using a commercially available barrier PET film (GX film manufactured by Toppan Insatsu Co.) instead of using the 12 μm-thick PET film having the inorganic barrier layer 9 formed on one surface thereof.

Example 9

A gas-barrier laminate 10 was obtained in the same manner as in Example 1 but using the granular moisture-absorbing agent in an amount of 50 parts by weight with respect to the polyallylamine.

Example 10

A gas-barrier laminate 10 was obtained in the same manner as in Example 1 but using the granular moisture-absorbing agent in an amount of 1000 parts by weight with respect to the polyallylamine.

Example 11

A gas-barrier laminate 10 was obtained in the same manner as in Example 1 but using, as the ionic polymer, a polyacrylic acid (AC-10LP manufactured by Nihon-Junyaku Co.) that was partly neutralized by 80% with sodium hydroxide, using, as the solvent, a water/acetone mixed solvent (weight ratio of 80/20), using, as the crosslinking agent, a diglycidyl 1,2-cyclohexanedicarboxylate in an amount of 15 parts by weight with respect to the partly neutralized product of the polyacrylic acid, using, as the adhesive, a β-(3,4-epoxycyclohexyl)ethyltrimethoxysilane in an amount of 3 parts by weight with respect to the partly neutralized product of the polyacrylic acid, and using the granular moisture-absorbing agent in an amount of 420 parts by weight with respect to the partly neutralized product of the polyacrylic acid.

Example 12

A gas-barrier laminate 10 was obtained in the same manner as in Example 11 but using the granular moisture-absorbing agent in an amount of 50 parts by weight with respect to the partly neutralized product of the polyacrylic acid.

Example 13

A gas-barrier laminate 10 was obtained in the same manner as in Example 11 but using the granular moisture-absorbing agent in an amount of 1300 parts by weight with respect to the partly neutralized product of the polyacrylic acid.

Example 14

By using an ion-exchange resin (Amberlite 200CT manufactured by Organo Co.), the Na salt type carboxyl group of the crosslinked product (HU-820E) of the Na polyacrylate was transformed into the H-type carboxyl group. Thereafter, by using a 1N aqueous solution of potassium hydroxide, there was obtained a crosslinked product (aqueous dispersion, solid component of 10%, average grain size $D_{50}$: 70 nm, neutralization ratio of 80%) of the K polyacrylate having the potassium salt type carboxyl group.
A gas-barrier laminate 10 was obtained in the same manner as in Example 1 but using the above crosslinked product of the K polyacrylate as the granular moisture-absorbing agent.

Comparative Example 1

Figure 6:
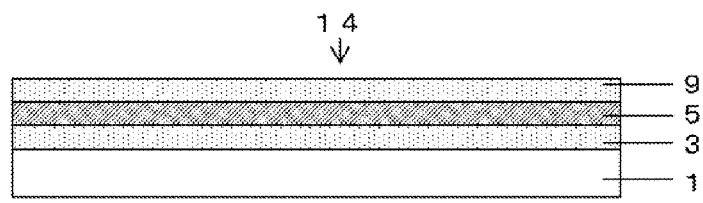
FIG. 6 is a sectional view schematically illustrating the structure of layers of a gas-barrier laminate fabricated in Comparative Example 1.

A laminate 14 of a layer structure shown in FIG. 6 was obtained in the same manner as in Example 1 but without forming the organic layer 7.

Comparative Example 2

Figure 7:
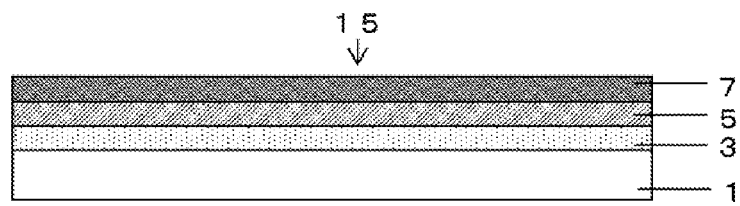
FIG. 7 is a sectional view schematically illustrating the structure of layers of a gas-barrier laminate fabricated in Comparative Example 2.

A laminate 15 of a layer structure shown in FIG. 7 was obtained in the same manner as in Example 1 but without forming the second inorganic barrier layer 9.

Comparative Example 3

A laminate 10 was obtained in the same manner as in Example 1 but using the crosslinked product of Na polyacrylate having an average grain size of 900 nm (TAFTIC HU-700E, aqueous dispersion containing 20% of solid component, average grain size ($D_{50}$), 900 nm, manufactured by Toyobo Co.) as the granular moisture-absorbing agent.

Comparative Example 4

A laminate 10 was obtained in the same manner as in Example 1 but using a polyvinyl alcohol (PVA 103 manufactured by Kuraray Co.) as the ionic polymer.

Comparative Example 5

Figure 8:
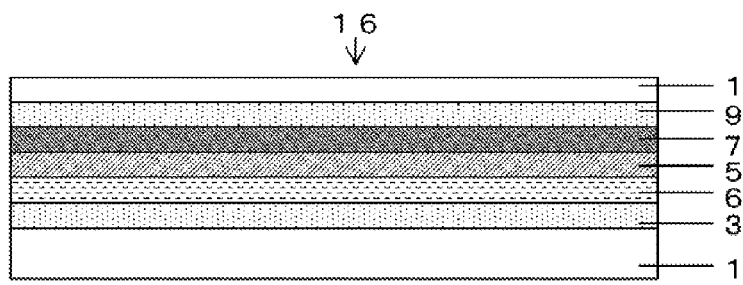
FIG. 8 is a sectional view schematically illustrating the structure of layers of a gas-barrier laminate fabricated in Comparative Example 5.

As the granular moisture-absorbing agent, a crosslinked product of Na polyacrylate having an average grain size of 4 μm (TAFTIC HU-720SF, average grain size: 4 μm, manufactured by Toyobo Co.) was dry-added to the LDPE (LUMITAC 08L55A manufactured by Toso Co.) in an amount of 43 parts by weight with respect thereto. The mixture was kneaded at 150° C. by using a biaxial kneader/extruder. By using two 12-μm thick PET films and a laminator, the mixture was taken up between the two PET films such that the water-trapping layer 5 assumed the thickness of 20 μm and that both surfaces of the water-trapping layer 5 were protected with the PET films. The PET films were removed in the gloved box in which the nitrogen concentration has been adjusted to be not less than 99.95%. The PET film coated with the inorganic barrier layer 3 used in Example 1 was dry-laminated on one surface of the water-trapping layer 5 via the 4 μm-thick urethane adhesive layer 6 in a manner that the vapor-deposited surface was on the inside. Next, a 12 μm-thick PET film having the inorganic barrier layer 9 formed on one surface thereof was dry-laminated on the other surface of the water-trapping layer 5 via a 4 μm-thick urethane adhesive layer as the organic layer 7 in a manner that the vapor-deposited surface was on the inside. In order to cure the adhesive resin layer so will not to absorb moisture, the laminate was aged at 50° C. for 3 days. There was obtained a laminate 16 of a layer structure as shown in FIG. 8.

<Evaluation Test>

The sample laminates prepared above were measured for their properties relying on the methods described above to obtain the results as shown in Table 1.

TABLE 1

| | Ionic polymer (amount) | Neutralization ratio (%) | *1 | *2 | *3 | *4 |
|---|---|---|---|---|---|---|
| Ex. 1 | polyallylamine (100) | — | 7.1 | HU-820E (400) | 0.0 | *b |
| Ex. 2 | polyallylamine (100) | — | 7.1 | HU-820E (400) | 0.0 | *b |
| Ex. 3 | polyallylamine (100) | — | 7.1 | HU-820E (400) | 0.0 | *b |
| Ex. 4 | polyallylamine (100) | — | 7.1 | HU-820E (400) | 0.0 | *b |
| Ex. 5 | polyallylamine (100) | — | 7.1 | HU-820E (400) | 0 | *b |
| Ex. 6 | polyallylamine (100) | — | 7.1 | HU-820E (400) | 0.0 | *b |
| Ex. 7 | polyallylamine (100) | — | 7.1 | HU-820E (400) | 0.0 | *b |
| Ex. 8 | polyallylamine (100) | — | 7.1 | HU-820E (400) | 0.0 | *b |
| Ex. 9 | polyallylamine (100) | — | 7.1 | HU-820E (50) | 0.0 | *b |
| Ex. 10 | polyallylamine (100) | — | 7.1 | HU-820E (1000) | 0.0 | *b |

| | *5 | Org. layer, glass transition point (° C.) | Second inorg. Layer | *6 | *7 | *8 Note: 1 (N/15 mm) |
|---|---|---|---|---|---|---|
| Ex. 1 | — | Vylon GK 880 84 | yes | ⊚ (≤$10^{-5}$) | ○ (3.0) | ○ (1.35) |

TABLE 1-continued

| | | | | | | |
|---|---|---|---|---|---|---|
| Ex. 2 | — | TOPAS8007 78 | yes | ⊚ (≤$10^{-5}$) | ○ (2.3) | ○ (1.11) |
| Ex. 3 | — | Sumipex LG 35 90 | yes | ⊚ (≤$10^{-5}$) | ○ (3.1) | ○ (1.18) |
| Ex. 4 | — | polyvinyl chloride 87 | yes | ⊚ (≤$10^{-5}$) | ○ (3.9) | ○ (1.55) |
| Ex. 5 | — | PET 69 | yes | ⊚ (≤$10^{-5}$) | ○ (2.5) | ○ (>6.2) |
| Ex. 6 | — | adhesive layer <60 | yes | ⊚ (≤$10^{-5}$) | ○ (2.7) | ○ (>6.5) |
| Ex. 7 | — | PET 69 | yes | ⊚ (≤$10^{-5}$) | ○ (3.5) | ○ (>5.9) |
| Ex. 8 | — | adhesive layer <60 | yes | ⊚ (≤$10^{-5}$) | ○ (3.4) | ○ (>5.7) |
| Ex. 9 | — | Vylon GK 880 84 | yes | ○ (<$10^{-3}$) | ○ (3.2) | ○ (1.30) |
| Ex. 10 | — | Vylon GK 880 84 | yes | ○ (<$10^{-3}$) | ○ (3.8) | ○ (1.24) |

| | Ionic polymer (amount) | Neutralization ratio (%) | *1 | *2 | *3 | *4 |
|---|---|---|---|---|---|---|
| Ex. 11 | polyacrylic acid (100) | 80 | | 7.9 | HU-820E (420) | 0.0 *c |
| Ex. 12 | polyacrylic acid (100) | 80 | | 7.9 | HU-820E (50) | 0.0 *c |
| Ex. 13 | polyacrylic acid (100) | 80 | | 7.9 | HU-820E (1300) | 0.0 *c |
| Ex. 14 | polyallylamine (100) | — | | 7.1 | *a | 0.0 *b |
| Comp. Ex. 1 | polyallylamine (100) | — | | 7.1 | HU-820E (400) | 0.0 *b |
| Comp. Ex. 2 | polyallylamine (100) | — | | 7.1 | HU-820E (400) | 0.0 *b |
| Comp. Ex. 3 | polyallylamine (100) | — | | 7.1 | HU-700E (400) | 8.2 *b |
| Comp. Ex. 4 | polyvinyl alcohol (100) | — | | 68.0 | HU-820E (400) | 0.0 *b |
| Comp. Ex. 5 | polyethylene (100) | — | | 77.0 | HU-720SF (43) | 9.0 — |

| | *5 | Org. layer, glass transition point (° C.) | Second inorg. Layer | *6 | *7 | *8 Note: 1 (N/15 mm) |
|---|---|---|---|---|---|---|
| Ex. 11 | *d | Vylon GK 880 84 | yes | ⊚ (≤$10^{-5}$) | ○ (3.1) | ○ (1.30) |
| Ex. 12 | *d | Vylon GK 880 84 | yes | ○ (<$10^{-3}$) | ○ (4.0) | ○ (1.35) |
| Ex. 13 | *d | Vylon GK 880 84 | yes | ○ (<$10^{-3}$) | ○ (3.9) | ○ (1.37) |
| Ex. 14 | — | Vylon GK 880 84 | yes | ⊚ (≤$10^{-5}$) | ○ (3.2) | ○ (1.35) |
| Comp. Ex. 1 | — | no | yes | X ($10^{-3}$) | X (27.3) | — |
| Comp. Ex. 2 | — | Vylon GK 880 84 | no | X ($10^{-3}$) | X (39.1) | ○ (1.28) |
| Comp. Ex. 3 | — | Vylon GK 880 84 | yes | X ($10^{-3}$) | ○ (4.2) | ○ (1.39) |
| Comp. Ex. 4 | — | Vylon GK 880 84 | yes | X ($10^{-3}$) | ○ (3.1) | ○ (1.33) |
| Comp. Ex. 5 | — | Vylon GK 880 84 | yes | X ($10^{-3}$) | ○ (4.1) | ○ (>5.2) |

*1: Ionic polymer, attained humidity (% RH),
*2: Moisture absorber (amount per 100 wt pts of ionic polymer),
*3: Moisture absorber, attained humidity (% RH),
*4: Crosslink agent (amount per 100 wt pts of ionic polymer),
*5: Adhesive (amount per 100 wt pts of ionic polymer),
*6: Moisture permeability (g/m²/day),
*7: Percentage of water content (%),
*8: Adhesion on trap layer/org. layer interface
*a: K salt polyacrylic acid crosslink ptcls,
*b: γ-glycidoxypropylmethoxysilane (15),
*c: diglycidyl 1,2-cyclohexanedicarboxylate (15)
*d: β-(3,4-epoxycyclohexyl)ethyltrimethoxysilane (3)

Note 1 in Table 1: Interfaces other than the water-trapping layer/organic layer interface, have adhesive forces that are not larger than the adhesive force in the water-trapping layer/organic layer interface.

<Water Trap Test Using the Composition for Forming the Water-Trapping Layer>

A composition was prepared by blending 100 parts by weight of the ionic polymer (polyallylamine) with 420 parts by weight of the granular moisture-absorbing agent (TAFTIC HU-820E) and 20 parts by weight of the cross-linking agent (γ-glycidoxypropyltrimethoxysilane). 0.5 Grams of the composition was dried at 140° C. for one hour and was, thereafter, weighed, left to stand in atmospheres of a temperature of 30° C. and humidities of 20, 30 and 40% RH for 5 minutes, respectively, and was weighed again.

Figure 9:
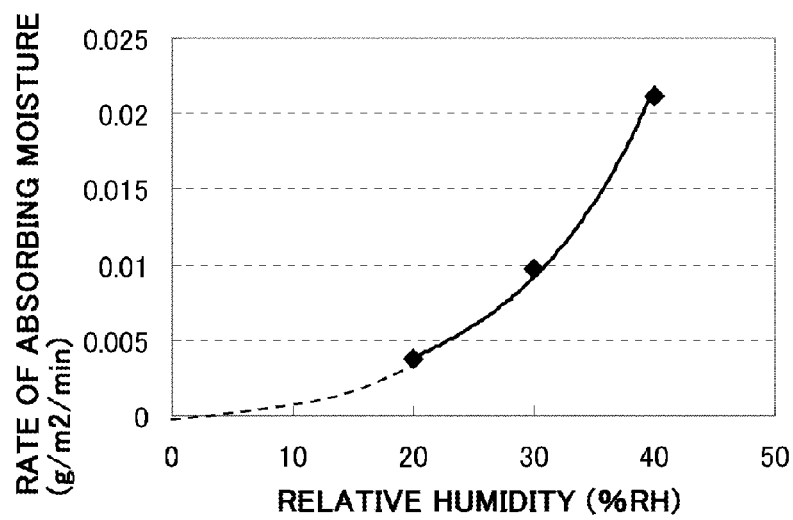
FIG. 9 is a diagram illustrating a relationship between the humidity and the rate of absorbing moisture of a composition for forming the water-trapping layer as measured by conducting a water-trap testing.

The rates of absorbing moisture of the composition for forming the water-trapping layer at each of the humidities were calculated from the increments in the weight that were found. The results were as shown in FIG. 9. Further, the rate of absorbing moisture in an atmosphere of a very low humidity was found by extrapolation.

The rate of absorbing moisture of the water-trapping layer in the atmosphere of a very low humidity as found by extrapolation was $10^{-4}$ g/m²·min while the water vapor permeability of the inorganic barrier layer-coated PET film used in Example 1 in an atmosphere of 40° C. 90% RH was $10^{-3}$ g/m²/day, i.e., $10^{-7}$ g/m²·min. It was, therefore, learned that the water-trapping layer formed by using the composition for forming the trapping layer was capable of trapping water even in the atmosphere of a very low humidity and was capable of trapping water at a rate sufficiently larger than a rate at which water has passed through the inorganic barrier layer.

Further, the following experiment was conducted in order to prove the confinement of the moisture in the moisture-absorbing agent trapped through the matrix.

0.5 Grams of the sample to be measured was dried at 140° C. for one hour and was put into a cup of a water-impermeable steel-foiled laminate having a volume of 85 cm³ together with a wireless thermometer/hygrometer (Hygroclone, manufactured by KN Laboratories Co.) in an atmosphere of 30° C. 80% RH. The mouth of the container was heat-sealed with a lid of an aluminum foil-laminated film. The sample was left to stand for one day. Thereafter, the sample was left to stand at temperatures of −20, 5, 22, 30 and 40° C. each for 3 hours. Relative humidities in the container were regarded as the humidities attained at each of the temperatures.

Figure 10:
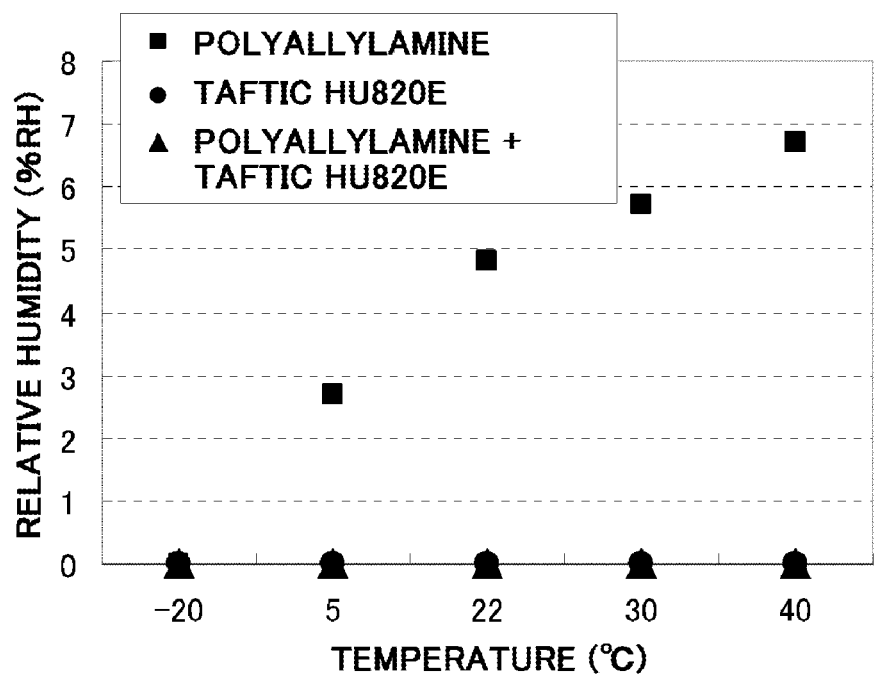
FIG. 10 is a diagram illustrating a relationship between the temperature and the humidity attained by a composition for forming the water-trapping layer as measured by conducting the water-trap testing.

FIG. 10 shows humidifies attained by using, as samples to be measured, the ionic polymer (polyallylamine), the granular moisture-absorbing agent (TAFTIC HU-820E), and a mixture of the ionic polymer and the granular moisture-absorbing agent at a ratio of 1:1 at each of the temperatures.

As the temperature rose, the ionic polymer permitted the humidity to rise in the container while both the granular moisture-absorbing agent and the mixture of the ionic polymer and the granular moisture-absorbing agent worked to lower the humidity in the container down to the absolutely dry state. Since the mixture exhibits the humidity-absorbing capability equivalent to that of when the moisture-absorbing agent alone is used, it is learned that the moisture absorbed by the ionic polymer is not released to the exterior despite of a rise in the temperature but remains trapped therein due to the moisture-trapping agent that has a large moisture-absorbing capability (i.e., can attain a low humidity).

DESCRIPTION OF REFERENCE NUMERALS

1: plastic base material
3: first inorganic barrier layer

5: water-trapping layer
6: layer of urethane adhesive
7: organic layer
9: second inorganic barrier layer
10, 11, 12, 13, 14, 15, 16: laminates

The invention claimed is:

1. A gas-barrier laminate of a structure in which a first inorganic barrier layer, a water-trapping layer and a second inorganic barrier layer are provided in this order on a plastic base material, wherein:
   said water-trapping layer is a layer in which a granular moisture-absorbing agent is dispersed in a matrix of an ionic polymer, the granular moisture-absorbing agent being more hygroscopic than the matrix that it is dispersed in;
   an organic layer is provided between said water-trapping layer and the second inorganic barrier layer, the organic layer serving as an underlying layer for forming said second inorganic barrier layer; and
   second inorganic barrier layer has a water vapor permeability of not more than $10^{-1}$ g/m$^2$/day which is larger than a water vapor permeability of the first inorganic barrier layer.

2. The gas-barrier laminate according to claim 1, wherein said granular moisture-absorbing agent is a crosslinked product of a monovalent metal salt of poly(meth)acrylic acid.

3. The gas-barrier laminate according to claim 1, wherein a crosslinked structure has been introduced into the ionic polymer that is forming said matrix.

4. The gas-barrier laminate according to claim 1, wherein said organic layer has an adhesive force to the water-trapping layer of not less than 1.0 N/15 mm.

5. The gas-barrier laminate according to claim 4, wherein said organic layer is a resin layer having a glass transition point of not lower than 60° C.

6. The gas-barrier laminate according to claim 5, wherein said organic layer is formed of a polyester resin, a cycloolefin-type resin, a (meth)acrylic resin or a halogen-type resin.

7. The gas-barrier laminate according to claim 1, wherein the first inorganic barrier layer is an inorganic oxide film formed by the CVD method.

8. The gas-barrier laminate according to claim 1, wherein the gas-barrier laminate has a water vapor permeability of not more than $10^{-5}$ g/m$^2$/day.

* * * * *